United States Patent [19]

Okajima et al.

[11] Patent Number: 5,065,404
[45] Date of Patent: Nov. 12, 1991

[54] TRANSVERSE-MODE OSCILLATION SEMICONDUCTOR LASER DEVICE

[75] Inventors: Masaki Okajima, Kawasaki; Genichi Hatakoshi, Yokohama; Masayuki Ishikawa, Nishimine; Yutaka Uematsu, Yokohama; Nawoto Motegi, Hayama, all of Japan

[73] Assignee: Kabushiki Kaisha Toshiba, Kawasaki, Japan

[21] Appl. No.: 551,996

[22] Filed: Jul. 12, 1990

[30] Foreign Application Priority Data

Jul. 12, 1989 [JP] Japan .................................. 1-178086
Oct. 31, 1989 [JP] Japan .................................. 1-281703

[51] Int. Cl.$^5$ .............................................. H01S 3/19
[52] U.S. Cl. ........................................ 372/46; 372/45
[58] Field of Search ............................. 372/43, 45, 46

[56] References Cited

U.S. PATENT DOCUMENTS

| 4,480,331 | 10/1984 | Thompson | 372/46 |
| 4,635,268 | 1/1987 | Motegi et al. | 372/45 |
| 4,961,197 | 10/1990 | Tanaka et al. | 372/45 |

FOREIGN PATENT DOCUMENTS

| 0181390 | 7/1988 | Japan | 372/43 |
| 0221691 | 9/1988 | Japan | 372/43 |
| 0236676 | 9/1989 | Japan | 372/43 |
| 0239988 | 9/1989 | Japan | 372/43 |

*Primary Examiner*—Georgia Epps
*Attorney, Agent, or Firm*—Oblon, Spivak, McClelland, Maier & Neustadt

[57] ABSTRACT

A visible-light wavelength continuous oscillation laser is disclosed which has an N type GaAs substrate, an N type GaAlAs cladding layer formed on the substrate, and a non-doped GaAlAs active layer formed on the cladding layer. The laser further includes two N type GaAlAs layers, a P type GaAlAs optical guide layer, a P type cladding layer consisting of upper and lower portions, and a ridge section. The N type GaAlAs layers contact both sides of the ridge section. The optical guide layer is sandwiched between the upper and lower portions of the P type cladding layer, is located within the ridge section, and has a refractive index greater than that of the P type cladding layer. The distance between the active layer and the optical guide layer does not depend on the condition in which etching is performed to form the ridge section, but depends basically on the time required to grow crystal.

23 Claims, 19 Drawing Sheets

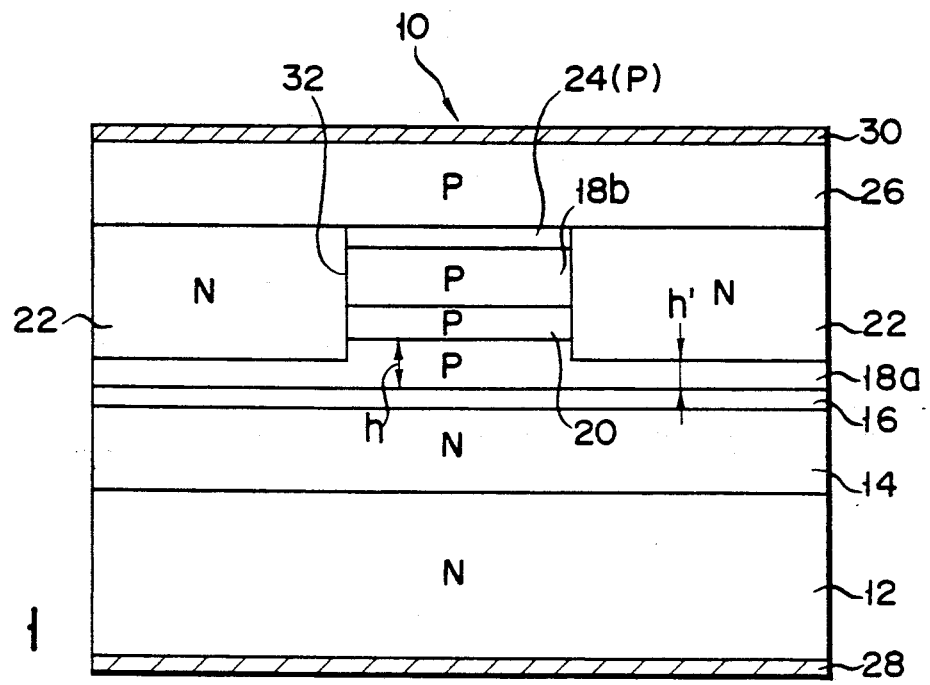
F I G. 1
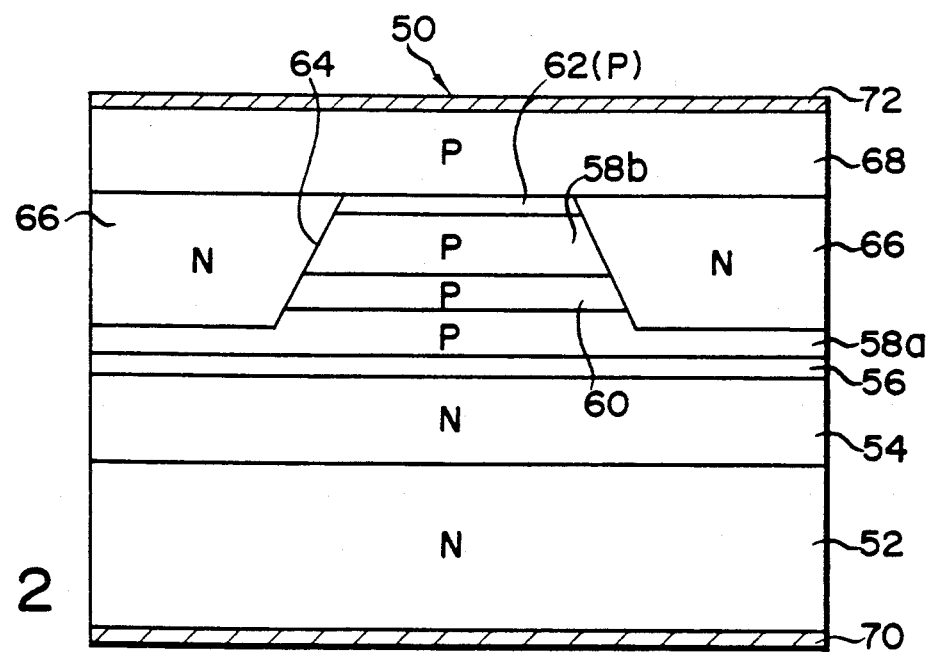
F I G. 2

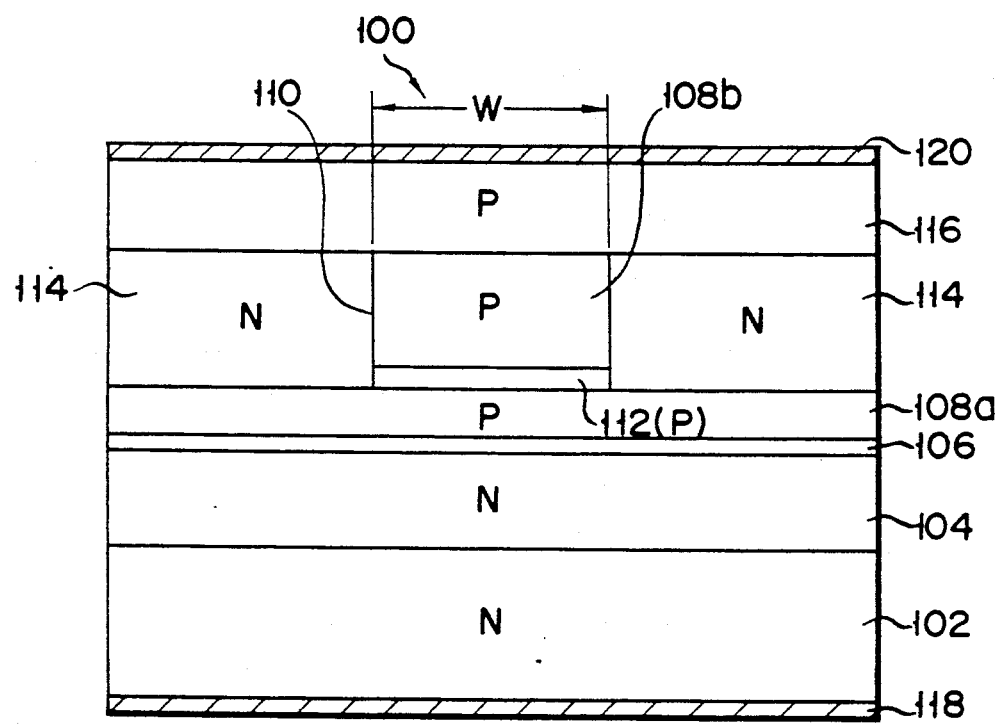
F I G. 3

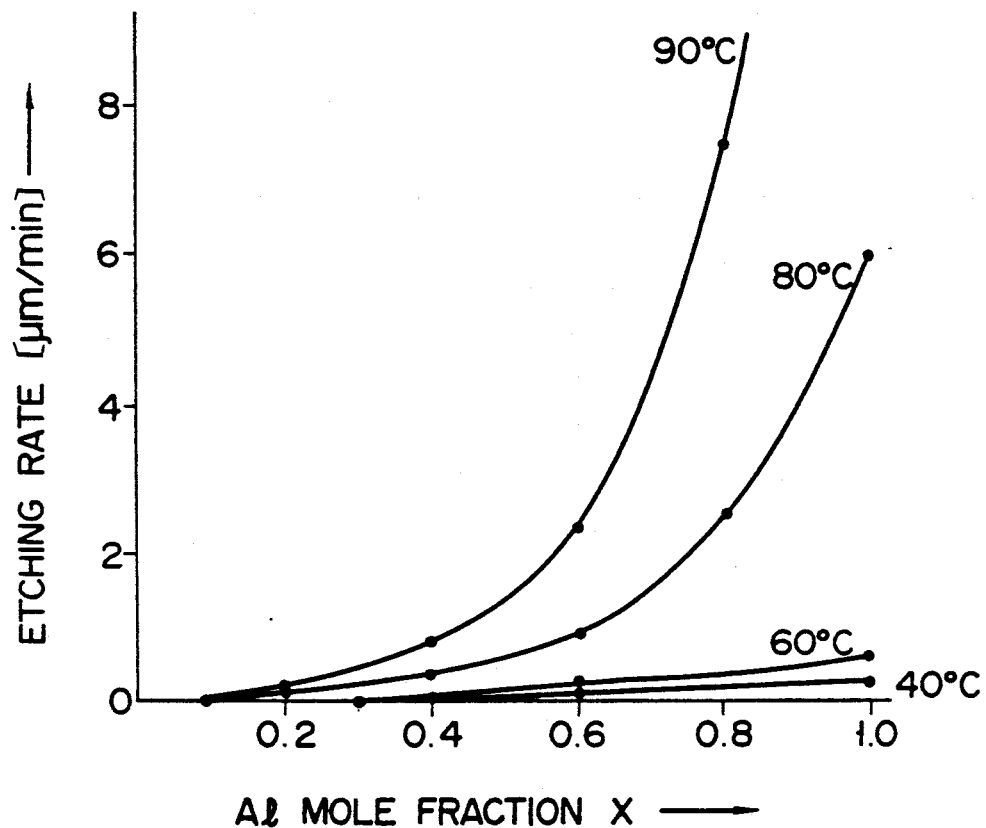
F I G. 6

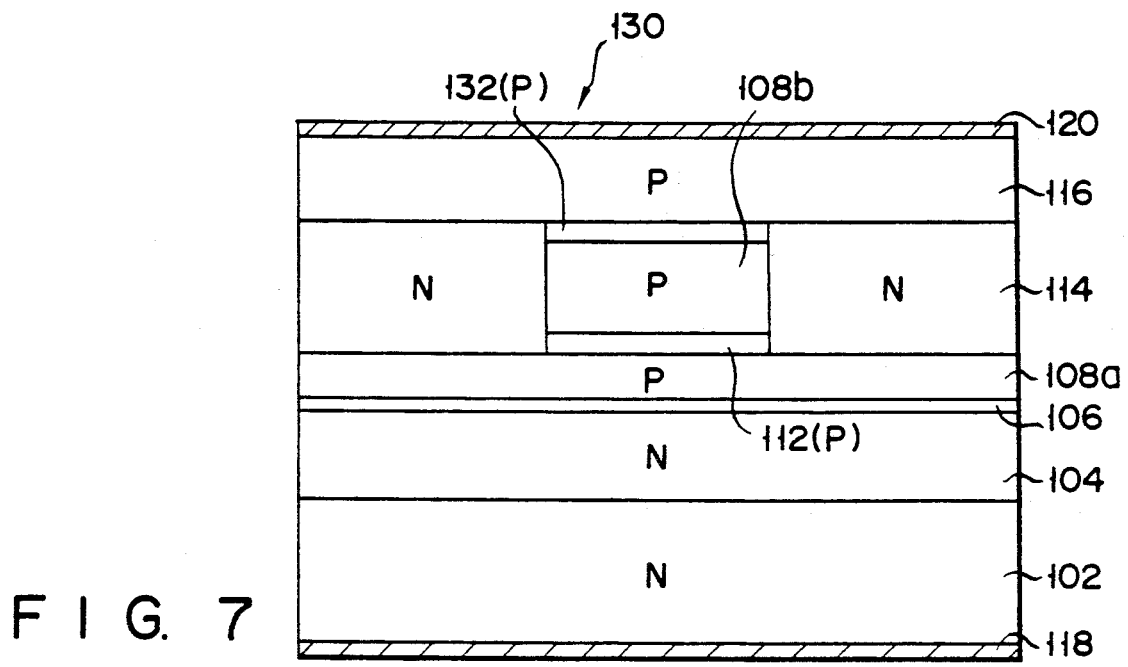
F I G. 7
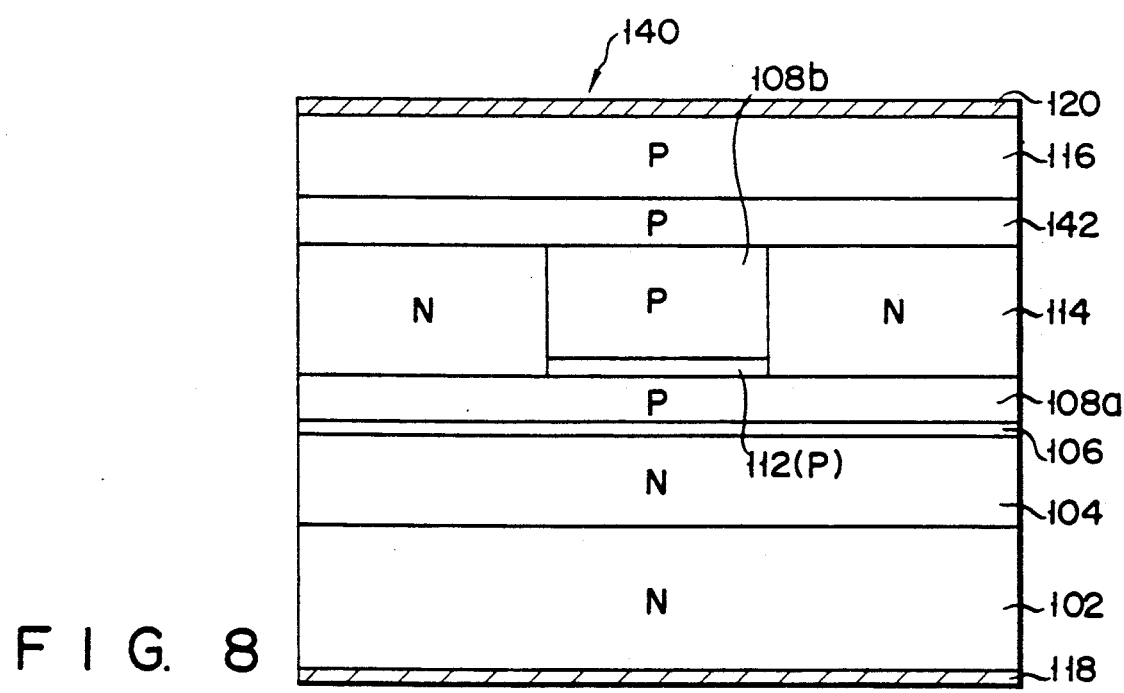
F I G. 8

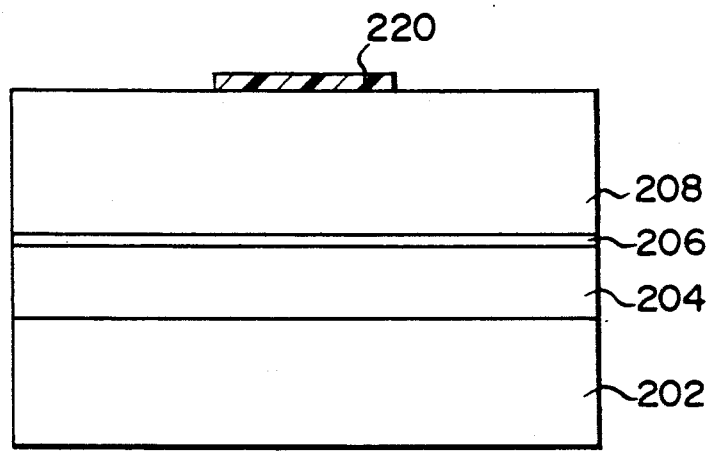
F I G. 11A
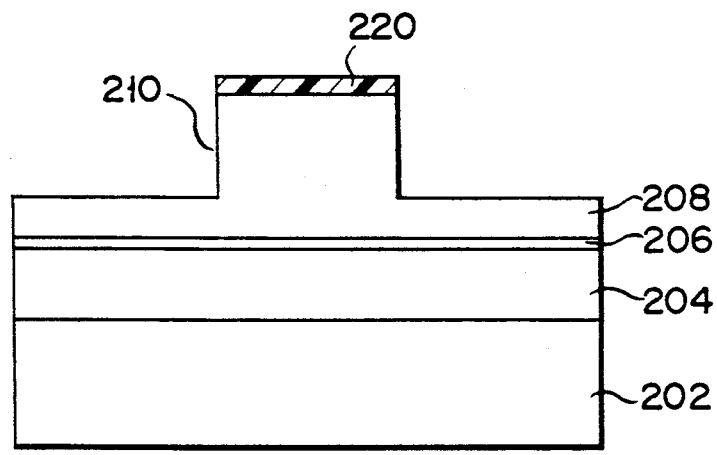
F I G. 11B
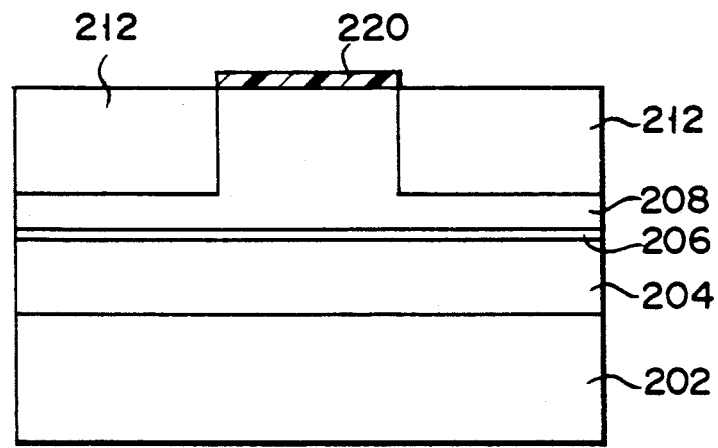
F I G. 11C

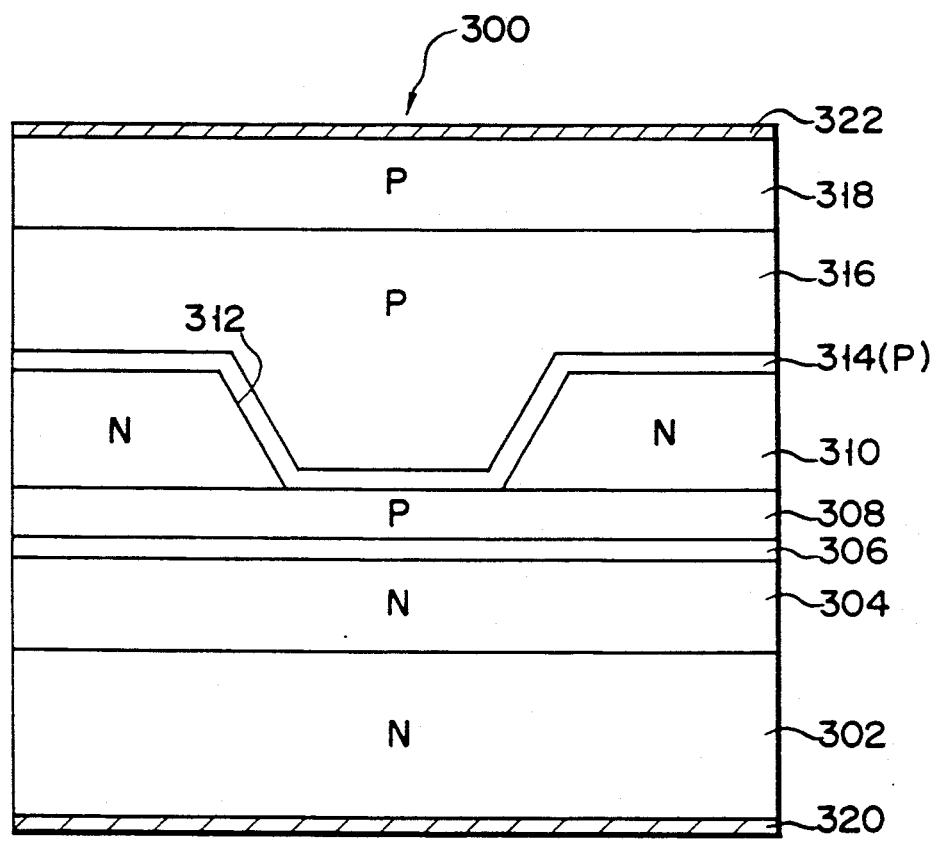
F I G. 12

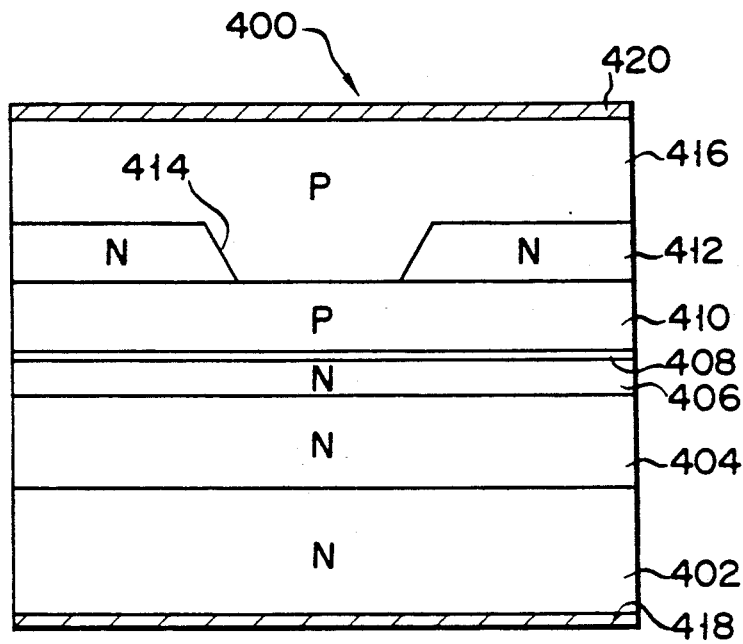
F I G. 15
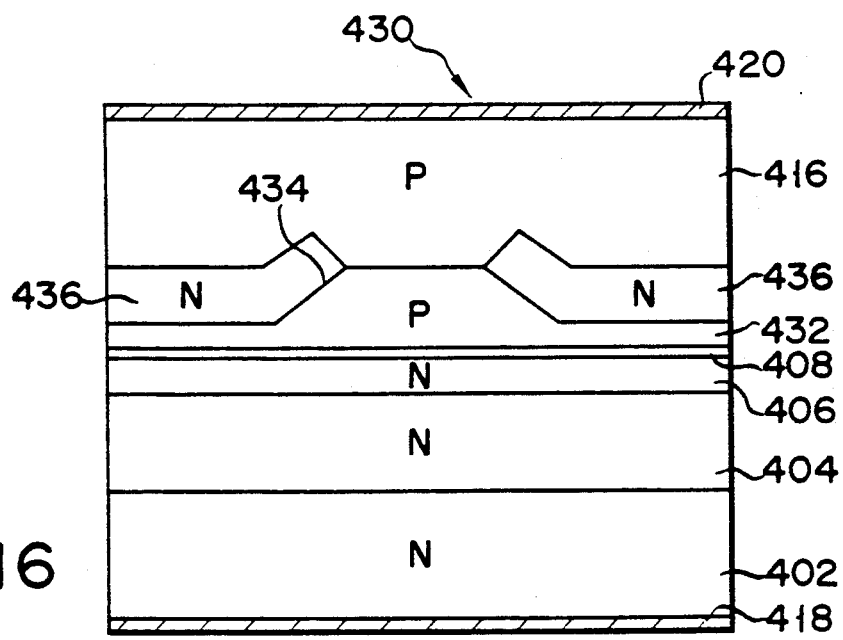
F I G. 16

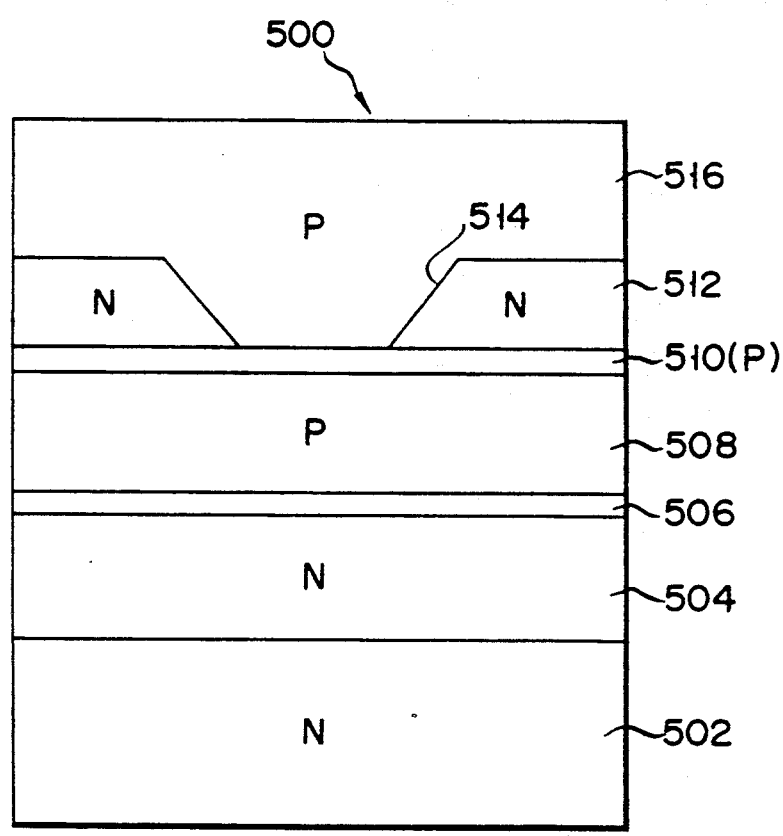
F I G. 20

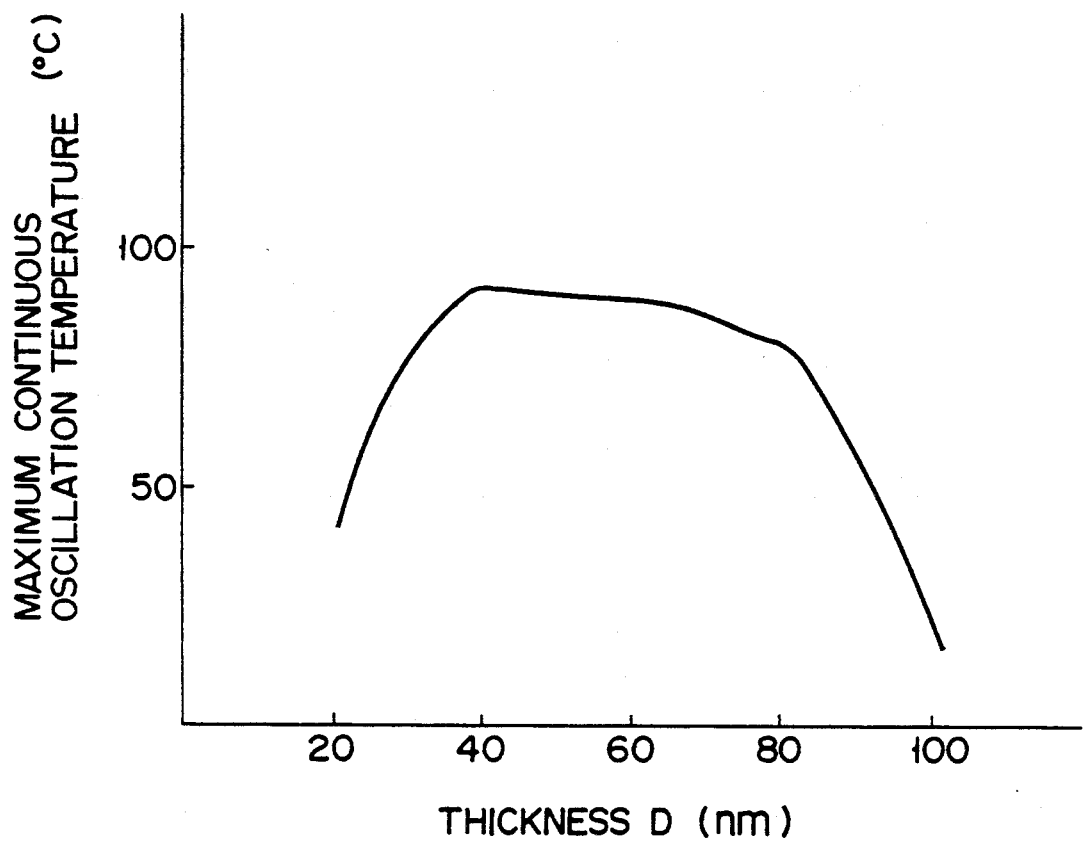
F I G. 21

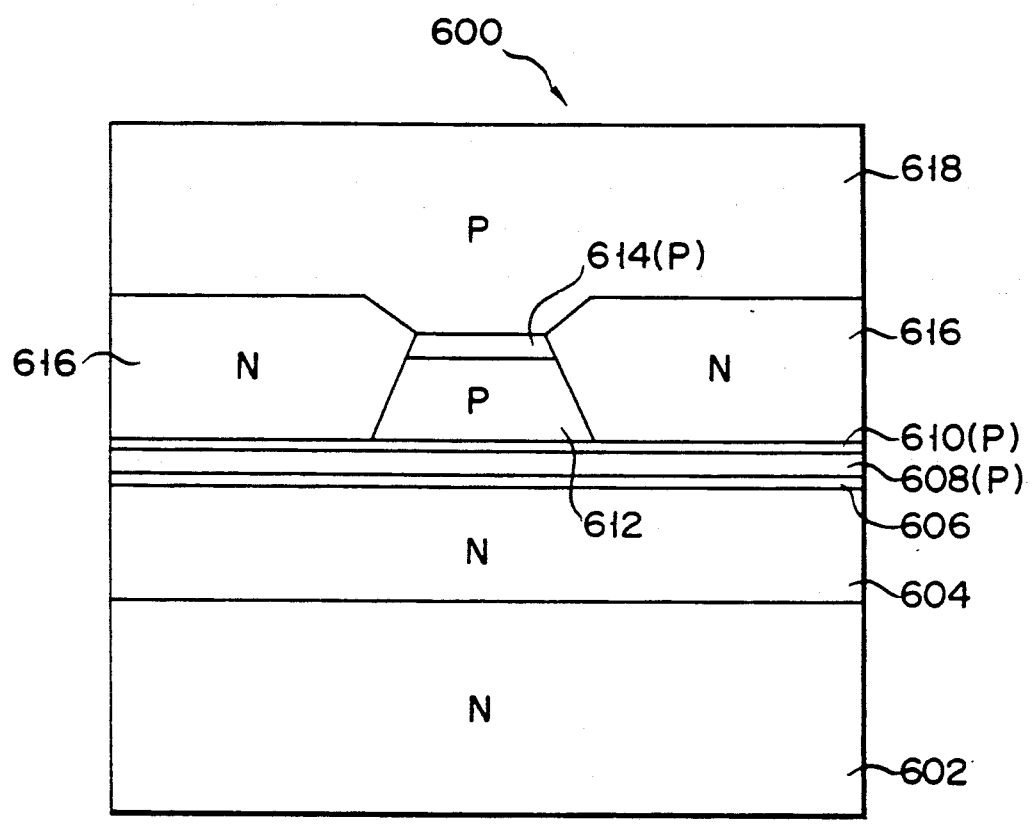
F I G. 22

TRANSVERSE-MODE OSCILLATION SEMICONDUCTOR LASER DEVICE

BACKGROUND OF THE INVENTION

1. Field of the Invention

The present invention relates to solid-state light-emitting devices and, more particular, semiconductor laser devices that are preferably used as solid-state light sources in an optical data-processing apparatus, an optical measuring apparatus, or the like.

2. Description of the Related Art

In recent years, solid-state light-emitting devices are necessarily used in processing optical data, optical measuring of physical values, and similar technical fields. A semiconductor laser, for example, is often used as a light source for writing data onto, or reading data from, a disk-shaped optical data storage media. In such cases, it should be required that the semiconductor laser absolutely has excellent basic beam characteristics. To meet the technical requirement, the semiconductor laser must be satisfied with the following specifications: it exhibits a stable fundamental transverse mode oscillation throughout its high power output range, while the beam astigmatism is kept little.

With the presently available manufacturing technology, it is by no means easy to manufacture laser diodes with fundamental transverse-mode oscillation, for the following reasons. Whether or not a semiconductor laser device can perform fundamental transverse-mode oscillation greatly depends on the structural dimensions, such as shape, size, or the like, (in particular, the width W) of the stripe-shaped light-guiding groove (ridge waveguide) portion of the laser device. The ridge waveguide portion can be formed by existing etching process to have a sufficiently precise width W if the mask used in the etching process has accurate dimensions. However, the thickness of the cladding layer, which is located just beneath the waveguide portion, cannot be satisfactorily controlled unless the etching conditions are minutely and precisely adjusted. To adjust these conditions precisely in accordance with varying factors concerning the manufacture of the semiconductor laser device, it is necessary for the manufacturer to employ high technology which has not been put to general use. Introducing such highly advanced, special technology would be a great risk to the semiconductor manufacturers, from a commercial point of view.

"Extended Abstract of 17th Conference on Solid State Devices an Materials," Tokyo (1985), pp. 67–70, discloses and m-ECO type semiconductor laser. This device exhibits fundamental transverse-mode oscillation within its optical output range. Reportedly, the device is excellent in beam characteristics such as beam astigmatism characteristic. The effective refractive index within the stripe-shaped, grooved portion of this laser device is different from that outside the grooved portion, so that the device can perform stable transverse-mode oscillation. In addition, since the current-blocking layer of the laser device is made of gallium-aluminum-arsenide (GaAlAs), the optical loss outside the grooved portion is small, resulting in reduction of astigmatism.

The semiconductor laser disclosed in the above-identified document, is disadvantageous, however, in that the crystalline quality of the interface of the stripe-shaped, grooved portion is deteriorated. More specifically, the laser has been made by forming, among other components, an optical guide layer on the stripe-shaped etched groove, a cladding layer on the optical guide layer, and a contact layer on the cladding layer, by means of crystal growth. Hence, semiconductor crystals grow further on the aluminum-containing layer included in the grooved portion, as an electric current flows through the grooved portion while the laser is emitting a beam. The more aluminum the cladding layer contains, the more the crystalline quality is deteriorated. Therefore, the m-ECO type semiconductor laser cannot be modified into indium-gallium-aluminum-phosphide (InGaAlP) semiconductor lasers.

Another document, "Extended Abstract of 17th Conference on Solid State Devices and Materials," Tokyo (1986), pp. 153–156, discloses a ridge-stripe type InGaAlP laser which has been designed to solve the problem inherent in the m-ECO type semiconductor laser. Since this InGaAlP laser has been made by a method which includes no steps of re-growing crystals on the aluminum-containing semiconductor layer, the interface of the stripe-shaped, grooved portion has good crystalle quality. However, this laser will have a great optical loss if the stripe-shaped ridge section has a small width W in order to improve the mode stability in high-power oscillating operation. Inevitably, the astigmatism characteristic of the laser will be deteriorated, though the laser performs a stable transverse mode oscillation. Obviously, the laser can neither perform a stable transverse-mode oscillation nor have good beam characteristic, if designed to emit a high optical output.

Either of the conventional laser devices, described above, has a transverse-mode characteristic which greatly depends on the width W of the stripe-shaped portion. Hence, the stripe-shaped portion must have a desired width W. To form the a stripe-shaped portion having the desired width W, the manufacturer of the laser device need to employ high technology which has not been put to general use. Since such high technology is too expensive to utilize, it remains practically difficult to manufacture a semiconductor laser device which has a good beam characteristic and performs a stable transverse-mode oscillation, to emit a high optical output.

SUMMARY OF THE INVENTION

It is therefore an object of the present invention to provide a new and improved semiconductor laser device.

It is another object of the invention to provide a new and improved semiconductor laser device which is excellent in its basic characteristics and can be successfully manufactured by means of the existing technology.

In accordance with the above objects, the present invention is addressed to a specific semiconductor laser device which comprises a semiconductor substrate, a first semiconductor cladding layer formed on the semiconductor substrate, and a semiconductor active layer formed on the first cladding layer. The laser device further comprises a second semiconductor cladding layer, a ridge portion, and a ridge side layer, a semiconductor layer with a high refractive index, and an optical guide layer. The second semiconductor layer is formed on the active layer, and is different in conductivity type from the first cladding layer. The semiconductor ridge side layer contacts the ridge portion. The high-refraction semiconductor layer is located within the ridge portion and also within the second cladding layer, separating the second cladding layer into upper and lower portions, and having a refractive index higher than that of the second cladding layer. The distance between the active layer and the optical guide layer does not depend on the conditions of the etching process by which the ridge portion has been formed; rather, it is determined basically by the time required for the lower portion of the second cladding layer to grow completely. Therefore, the semiconductor laser device according to the invention can be manufactured by the existing technology, and can yet perform a stable transverse-mode oscillation and also produce a high output.

The invention, and its objects and advantages will become more apparent from the following detailed description of preferred embodiments.

BRIEF DESCRIPTION OF THE DRAWINGS

In the detailed description of preferred embodiments of the present invention, presented below, reference is made to the accompanying drawings, in which:

FIG. 1 is a sectional view schematically showing an InGaAlP semiconductor laser according to a first preferred embodiment of the present invention;

FIG. 2 is a sectional view illustrating a modification of the laser shown in FIG. 1;

FIG. 3 is a sectional view schematically showing an InGaAlP semiconductor laser according to a second preferred embodiment of the present invention;

FIG. 6 is a graph showing the dependency of the rate of etching using sulfuric acid, upon the aluminum mole fractions x of the layers 112 and 114;

FIG. 7 is a sectional view illustrating a modification of the laser shown in FIG. 3;

FIG. 8 is a sectional view schematically showing another modification of the laser shown in FIG. 3;

FIGS. 111A to 11C illustrate, in schematic cross-section, some of the major steps of manufacturing the laser structure shown in FIG. 10;

FIG. 12 is a sectional view schematically showing an InGaAlP semiconductor laser according to a fourth embodiment of the invention;

FIG. 15 is a sectional view schematically showing an InGaAlP semiconductor laser according to a fifth embodiment of the present invention;

FIG. 16 is a sectional view schematically showing an InGaAlP semiconductor laser according to a sixth embodiment of this invention;

FIG. 20 is a sectional view schematically showing a semiconductor laser according to an eighth embodiment of this invention FIG. 21 is a graph representing how the maximum continuous oscillation temperature of the laser shown in FIG. 20 varies with the thickness of the P type InGaP cap layer; and FIG. 22 is a sectional view schematically showing a semiconductor laser according to a ninth embodiment of the present invention.

DETAILED DESCRIPTION OF THE PREFERRED EMBODIMENTS

Figure 4:
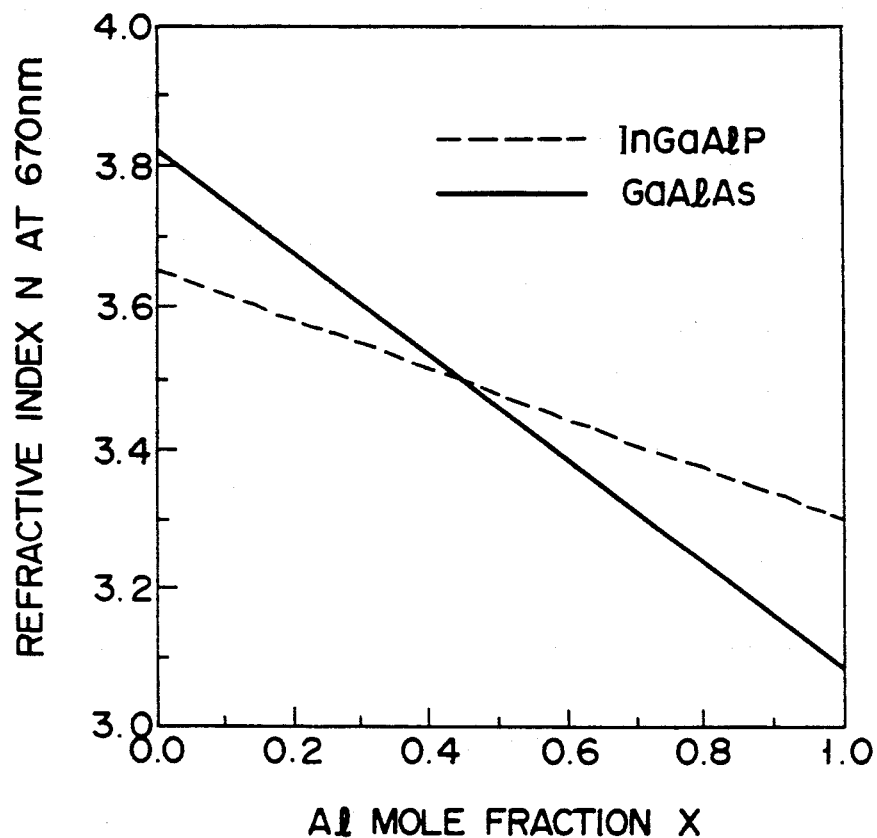
FIG. 4 is a graph representing the relationship between the aluminum mole fractions (i.e., aluminum mixture ratio) $x$ of the P-type InGaAlP optical guide layer 112 and N type GaAlAs current-blocking layer 114 of the laser shown in FIG. 3, on the one hand, and the refractive indices which the layers 112 and 114 exhibit to the oscillation wavelength of about 670 nanometers, on the other hand.

Referring now to FIG. 1, a semiconductor laser in accordance with one preferred embodiment of the present invention is generally designated by reference numeral "10." This laser 10 basically has the double-heterostructure. In this figure, as well as the remaining figures, layers constituting each laser device is illustrated so that the physical size thereof, such as thickness, width, or the like, is not drawn to scale for the purpose of facilitating the understanding of the laser device.

Laser 10 has a GaAs substrate 12 of N conductivity type. Sequentially formed on substrate 12 are a first cladding layer 14 made of N type $Ga_{l-x}Al_x$as, a non-doped $Ga_{l-x}Al_x$As active layer 16, a P type $Ga_{l-y}Al_y$As layers 18a and 18b serving as the second cladding layer, and optical waveguide layer 20, known as the "optical guide layer" for short, which is made of P type $Ga_{l-z}Al_z$As layer sandwiched between layers 18a and 18b. Note that the optical guide layer 20 is sandwiched between the cladding layers 18a and 18b, whereby optical guide layer 20 divides the second cladding layer into the upper cladding layer 18b and the lower cladding layer 18a.

The second cladding layer 18 and the optical guide layer 20 are fabricated by etching at their peripheral regions; $Ga_{l-w}Al_w$As current blocking layer 22 is formed in the etched regions of layers 18 and 20 as shown in FIG. 1. A P type GaAs cap layer 24 is formed on the fabricated cladding layer 18b. As is evident from FIG. 1, the upper surface of the layer 24 is at substantially the same level as that of the current-blocking layer 22.

A P type GaAs contact layer 26 lies on the top surfaces of the layers 22 and 24. A metal layer 28 is formed on the lower surface of the substrate 12, and functions as N-side electrode. A metal layer 30 is formed on the contact layer 26, and functions as P-side electrode.

It should be noted that the parameters x, y, and z in the composition formulas, specified above, have the following relation:

$$y > z > x \qquad (1)$$

This relation coincides with the relationship among the layers in terms of the widths of their band gaps. Naturally, the relation among these layers in terms of refractive index is inverse to the relation (1).

It will now be explained how the semiconductor laser, described above, is manufactured. First, the layers 14, 16, 18a, 20, 18b, and 24 are sequentially formed by means of crystal growth, one on another, on the substrate 12. Then the peripheral regions of the layers 24, 18b, and 20 are etched away, and the peripheral region of the layer 18a is etched and made thinner than the center region. The center region of the layer 18a and the peripheral regions of the layers 20, 18b and 24 constitute a ridge section 32.

Subsequently, the current-blocking layer 22 is formed on the peripheral region of the layer 18a and around the ridge section 32 by means of crystal growth. More specifically, the layer can be formed by either of two methods. In the first method, MOCVD method is first performed, and lift-off technique is then applied to the ridge section 32. In the second method, selective MOCVD is performed by using, as a mask, a silicon oxide layer photoetched by using a resist pattern. Either method is commonly used at present, and its use will impose no economical risks on manufacturers of semiconductor devices.

After the patterning mask layer are removed, the P type GaAs layer 26 is formed as a contact layer. The electrode layers 28 and 30 are then formed on the lower surface of the substrate 12, and the surface of the contact layer 26, respectively. The semiconductor laser 10 is, thus, completed.

Of the component layers of the ridge section 32 through which an excitation current flows so that the laser perform oscillation, only the cap layer 24 is formed by means of re-growth of crystal. Crystal is re-grown appropriately on the aluminum-containing semiconductor layer, i.e., the layer 18b, and Unlike in the prior-art "m-ECO" type semiconductor laser, current does not flow in the interface between the layers 18b and 24. As a result, the laser shown in FIG. 1 can perform a stable transverse-mode oscillation with good reliability even at a high output power operation, though it is manufactured by the existing technology. In addition, the optical guide layer 20 promotes a leakage of the optical field into the second cladding layers 18a and 18b, so that the density of optical power at the active layer 16 is reduced. This greatly contributes to an increase in the output of the semiconductor laser.

Since the ridge section 32 can be formed with high precision, without using any special technology which would imposes a great economical risk on the manufacturer, the basic beam characteristics of the laser can be improved very much, as will be described in detail hereinafter. The diversion angle of the beam emitted by this laser may be determined largely depending upon the material composition, the thickness, and/or the width W of layers constituting the ridge section 32. More specifically, it may be fundamentally determined by the compositions of the layers 18a, 18b, and 20, the thickness of the active layer 16, and the distance h between the active layer 16 and the optical guide layer 20. In the case of the conventional "m-ECO" type semiconductor laser, the distance h can hardly have a desired value unless the etching conditions are controlled by means of a high-precision manufacture process control system. In contrast, according to the invention, not only the distance h, but also the thickness of each constituent layers of the ridge section 32, can be determined by the first crystal-growth conditions only, not by the etching conditions. The first crystal-growth conditions can be controlled with sufficient accuracy by the existing control system, and the first crystal growth can be carried out with ease and high reproducibility. The ridge section 32 can, therefore, have precise dimensions, making it possible to reduce astigmatism as much as is desired. Hence, the laser has excellent basic beam characteristics.

To confine the light generated by laser oscillation, the aluminum mole fraction (i.e., aluminum mixture ratio, or composition ratio) w of the current-blocking layer 22 may be set at various values.

In the first case:

$$w < z \qquad (2)$$

In the second case:

$$w > z \qquad (3)$$

In the third case:

$$w = z \qquad (4)$$

In the first case wherein $w < x$, the aluminum composition ratio w is less than that of the active layer 16, while the band-gap width of the current-blocking layer 22 is less than that of the active layer 16; accordingly, the current blocking layer 22 functions as an "oscillation-loss layer" in a waveguide mode. Under such condition, the embodiment laser 10 is a loss-waveguide type laser that is same as the conventional "ridge-stripe" type laser.

In the second case wherein $w > z$, the band-gap width of the current-blocking layer 22 is greater than that of the active layer 16. Therefore, since the layer 22 becomes transparent to the wavelength of the light generated by laser oscillation, the laser 10 is a low-threshold laser which has a relatively small optical loss, and achieves a transverse-mode oscillation of the same type as is effected by a refractive-index waveguide type such as the conventional m-ECO type semiconductor laser. In the transverse oscillation mode control of the index-guided laser, effective refractive index difference may be determined by distance h between the active layer 16 and the optical waveguide layer 20 located in the internal region of ridge section 32, and by distance h' between the active layer 16 and the current blocking layer 22 positioned in the external region of the ridge section 32. The distance h' varies depending upon the etching conditions in the manufacturing process of this laser. However, if the current blocking layer 22 is similar in its composition ratio to the P type cladding layer 18, the dependency of effective refractive index difference upon the distance h' that is easily variable can be reduced, with the result in the stability of transverse mode oscillation being improved.

In the third case in which $w = z$, since the current-blocking layer 22 has the same refractive index as that of the P type cladding layer 18, the effective refractive index difference of the laser in the outside region of the ridge section 32 is no longer dependent on the distance h'. As a result of this independence, the etching process for formation of the ridge section 32 will not require any high-precision etching control. The reason is that it is no longer required that care should be taken to precise control on when progressing etching is to be terminated at which thickness of the P type cladding layer 18a: the etching may be stopped at relatively large time error range that corresponds to etching time of layer 18a which is performed after the completion of etching the optical guide layer 20 and before the etching proces reaches the top surface of the active layer 16. In other words, the etching need not be completely stopped the moment the layer 18a is etched to a specific extent.

The semiconductor laser 10 may be modified as is illustrated in FIG. 2. The modified laser 50 is characterized in that its ridge section 64 is mesa-shaped.

The laser 50 has an N type GaAs substrate 52. A first cladding layer 54 is formed on the substrate 52, and an active layer 56 is formed on the first cladding layer 54. The first cladding layer 54 is made of N type $In_{0.5}(Ga_{1-y}Al_y)_{0.5}P$; the active layer 56 is made of non-doped $In_{0.5}(Ga_{1-x}Al_x)_{0.5}P$. The mesa-shaped ridge section 64 is composed of a lower cladding layer 58a formed on the active layer 56, an optical guide layer 60 formed on the lower cladding layer 58a, an upper cladding layer 58b formed on the optical waveguide layer 60, and a cap layer 62 formed on the upper cladding layer 58b. Both cladding layers 58a and 58b are made of P type $In_{0.5}(Ga_{1-y}Al_y)_{0.5}P$. The optical waveguide layer 60, which is interposed between the upper and lower cladding layers 58a and 58b, is made of P type $In_{0.5}(Ga_{1-z}Al_z)_{0.5}P$. The cap layer 62 is made of P type $In_{0.5}Ga_{0.5}P$.

As is shown in FIG. 2, a current-blocking layer 66 is formed on the thin portion of the lower cladding layer 58a and contacts both sides of the mesa-shaped ridge section 64. Its upper surface is at the same level as that of the contact layer 62. The current-locking layer 66 may be an N type $Ga_{1-w}Al_wAs$ layer. A P type GaAs contact layer 68 lies on the contact layer 62 and the current-blocking layer 66. A metal layer 70 is formed on the lower surface of the substrate 52 and functions as an N-side electrode. A metal layer 72 is formed on the GaAs contact layer 68 and functions as a P-side electrode.

In the laser 50, the composition parameters x, y, and z may have the relationship with the aluminum composition ratio w of the current-blocking layer 66, which is represented by formulas (2), (3) and (4). When the composition of the layer 66 is changed, the laser 50 can operates as a loss-waveguide type laser, like the semiconductor layer 10 shown in FIG. 1. For example, when w=0, the laser 50 functions as a loss-waveguide type laser. When w=0.8, x=0, y=0.5, and z=0.1, the laser 50 functions as an index-guided laser.

In the semiconductor layer described above, the laser 10 or the laser 50, the current-blocking layer is made of GaAlAs, and the semiconductor layers are made of InGaAlP materials. Nevertheless, the current-blocking layer can be made of InGaAlP, and the semiconductor layers can be made of InGaAsP materials, InGaAlAs materials, GaAlSb materials, or the like. In this case, too, either semiconductor laser can have the technical advantages described above.

A semiconductor laser in accordance with the second embodiment of the invention is generally designated by reference numeral "100" in FIG. 3 (not drawn to scale). As FIG. 3 clearly shows, the laser 100 has a GaAs substrate 102 of N conductivity type. It further comprises a first cladding layer 104, an active layer 106, and a second cladding layer 108a. The first cladding layer 104, which is made of N type $In_{0.5}(Ga_{0.3}Al_{0.7})_{0.5}P$, is formed on the upper surface of the substrate 102, has a thickness of typically 1 micrometer, and has a donor concentration of $4 \times 10^{17}$ atoms per cubic centimeter. The active layer 106, which is made of non-doped $In_{0.5}Ga_{0.5}P$, is formed on the first cladding layer 104 and has a thickness of typically 0.06 micrometers. The second cladding layer 108a, which is made of P type $In_{0.5}(Ga_{0.3}Al_{0.7})$ formed on the active layer 106 and has a thickness of typically 0.3 micrometers and an acceptor concentration of $5 \times 10^{17}$ atoms per cubic centimeter.

A stripe-shaped ridge section 110 is formed on the center portion of the second cladding layer 108a. The ridge section 110 consists of a optical guide layer 112 formed on the second cladding layer 108a, and a P type layer 108b formed on the optical guide layer 112 and functioning as a second cladding layer. The optical guide layer 112 is made of P type $In_{0.5}(Ga_{0.5}Al_{0.5})P$, is typically 0.15 micrometers thick, and has an impurity concentraiton of $5 \times 10^{17}$ atoms per cubic centimeter. The layer 108b is made of P type $In_{0.5}(Ga_{0.3}Al_{0.7})_{0.5}P$, has a thickness of typically 0.6 micrometers, and has an acceptor concentration of $5 \times 10^{17}$ atoms per cubic centimeter. As is evident from FIG. 3, the optical guide layer 112 separates the lower second cladding layer 108a from the upper second cladding layer 108b. The lower second cladding layer 108a is not etched, whereas the upper second cladding layer 108b is etched.

Two buried layers 114 are formed on the top surface of the lower second cladding layer 108b and contact the opposing sides of the ridge section 110, respectively. These buried layers 114 are of the conductivity type opposite to that of the layers 108a and 108b and the optical guide layer 112, and constitute a current-blocking layer 114. The layers 114 are, for example, N type $Ga_{0.45}Al_{0.55}As$ layers having a thickness of typically 0.7 micrometers and a donor concentration of $1 \times 10^{17}$ atoms per cubic centimeter. The top surfaces of the buried layers 114 are at the same level as that of the ridge section 110.

A contact layer 116 is formed on the top surface of the ridge section 110 and also the top surfaces of the buried layers 114. The contact layer 116 is made of P type GaAs, has a thickness of typically 1 micrometer, and has an acceptor concentration of $2 \times 10^{18}$ atoms per cubic centimeter. A metal layer 118 is formed on the lower surface of the semiconductor substrate 102, and functions as an N-side electrode. A metal layer 110 is formed on the contact layer 116, and functions as a P-side electrode.

The laser 100 is characterized in that the P type optical guide layer 112 has a refractive index greater than that of the buried layers 114. If the stripe-shaped optical guide layer 112 has a composition represented by formulas (5) and (6), the buried layers 114 has an aluminum composition ratio u given by formula (7):

| | |
|---|---|
| $In_t(Ga_{1-w}Al_w)_{1-t}P$ | (5) |
| $0.48 \leq t \leq 0.52$ | (6) |
| $0.48w + 0.23 < u < 0.8$ | (7) |

A semiconductor laser according to the second embodiment (FIG. 3) was actually manufactured, in which the layers 114 had an aluminum composition ratio u of 0.55 which falls within the range given by the following formula:

$$0.5 < u \leq 0.75 \qquad (7')$$

FIG. 4 is a graph representing the relationship between the aluminum mole fractions X of the P-type InGaAlP optical guide layer 112 and the N type GaAlAs current-blocking layer 114 of the laser shown in FIG. 3, on the one hand, and the refractive indices which the layers 112 and 114 exhibit to the oscillation wavelength of about 670 nanometers, on the other hand. This relationship is based on the results of the experiments conducted by the inventors hereof. In FIG. 4, the broken line shows variation in the refractive index n of P type InGaAlP optical guide layer 112, while the solid line designates change in the refractive index n of the N type GaAlAs current blocking layer 114. The composition ratio of aluminum of the P type InGaAlP optical guide layer 112 is designed to fulfill the requirements of formulas (5) and (6). The P type InGaAlP optical guide layer 112 has a refractive index n(112) which has the following value:

$$n(112) = 3.65 - 0.35w \qquad (8)$$

The N type GaAlAs current-blocking layer 114 has a refractive index n(114) which has the following value:

$$n(114) = 3.82 - 0.73u \qquad (9)$$

Therefore, the refractive indices n(112) and n(114) are inversely proportional to the aluminum mole fractions of the layers 112 and 114, respectively.

As may be understood from FIG. 4, particularly from the intersection of the solid line and the broken line, when the optical guide layer 112 has aluminum composition ratio of w, the aluminum composition ratio u of the current-blocking layer 114 should have the following value in order to give the optical guide layer 112 a greater refractive index than that of the current-blocking layer 114:

$$u > 0.48w + 0.23 \qquad (10)$$

It is from this formula (10) that the formula (7) has derived.

The inventors evaluated the operating characteristics of the semiconductor laser 100 and found that the difference $\Delta n$ in effective refractive index between the ridge section 110 and the current-blocking layer 114 was $3 \times 10^{-3}$. This value is great enough for the laser 100 to perform a stable transverse-mode oscillation. When the buried layers 114 were made of $Ga_{0.45}Al_{0.55}As$, they had an aluminum composition ratio u of 0.55 and was "transparent" to the laser oscillation wavelength. In this case, the laser 100 functioned as an index-guided type laser. When the stripe-shaped ridge section 110 had a width W of 2.5 micrometers or less, the laser 100 performed a stable transverse-mode oscillation, and emitted an isotropic beam having an aspect ratio of 3 or less. Further, the astigmatism was much suppressed, to 5 micrometers or less. Since the buried layers 114 had the conductivity type opposite to that of the ridge section 110, they could function as a current-blocking layer. Since the layers 114 served as a current-blocking layer, the laser 100 maintained an oscillation current threshold value as small as 30 mA or less, as demonstrated by the results of the test the inventors conducted on the laser 100.

Figure 5:
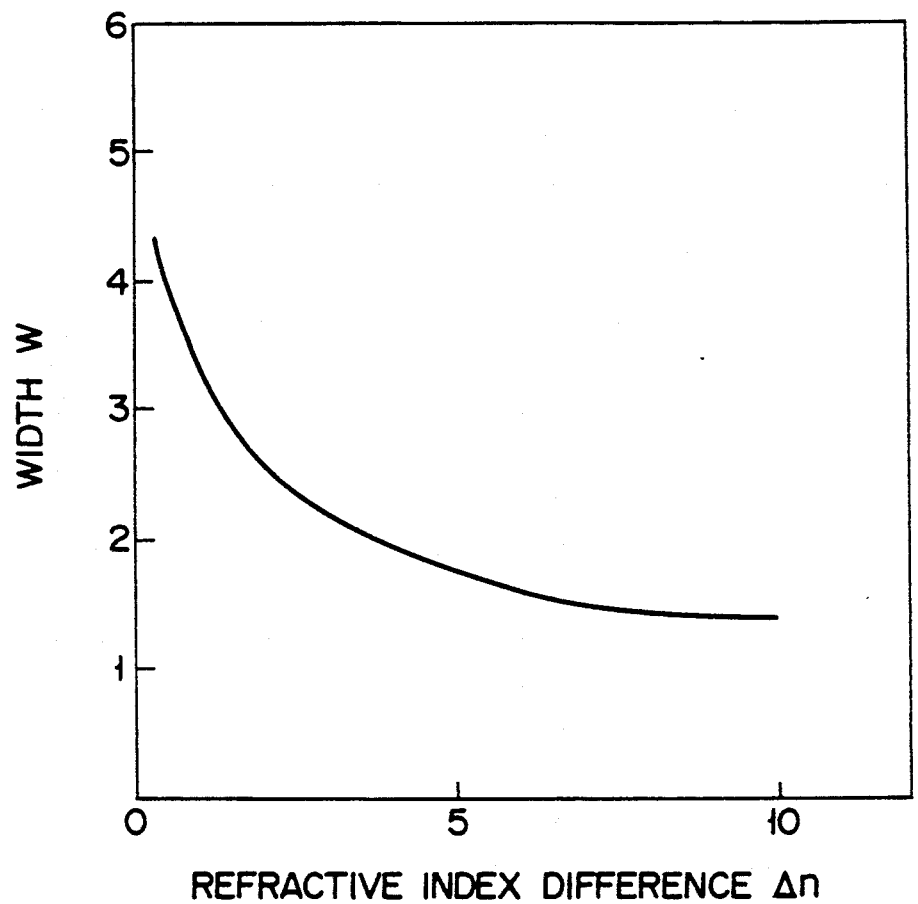
FIG. 5 is a graph representing the relationship between the width W of the ridge section of the laser shown in FIG. 3 which exhibits the fundamental transverse mode laser oscillation, and the difference $\Delta$ between the refractive index of the ridge section and that of the layer surrounding this ridge section.

The inventors carried out experiments in order to determine the relationship between the difference $\Delta n$ and the width W of the ridge section 110 and also the best possible value for the width W of the ridge section 110. The results were as is illustrated in the graph of FIG. 5. As may be understood from FIG. 5, as the difference $\Delta$ increases, the width W of the ridge section 110 should decrease exponentially to allow the laser 100 to perform a stable fundamental transverse-mode oscillation. In other words, as the greater the difference $\Delta$, the narrower the required stripe width for higher-order mode cutoff. To allow the laser 100 to accomplish a laser oscillation, a current must be supplied to the ridge section 110 in an amount of at least 1 kiloampere per square centimeter. To compensate for refractive index reduction due to the carrier injection, it is required that the difference $\Delta$ be:

$$\Delta > 1 \times 10^{-3} \qquad (11)$$

On the other hand, as is evident from FIG. 5, if the ridge section 110 has a width W of 1.5 micrometers or less, it will be extremely difficult to manufacture the laser 100 with a sufficient yield by means of the etching techniques available at present.

In view of the conflicting conditions described above, it is desirable that the difference $\Delta$ and the width W be set at the following values:

$$1 \times 10^{-3} < \Delta < 1 \times 10^{-2}$$

$$1.5 \text{ micrometers} \leq W \leq 3.5 \text{ micrometers} \qquad (12)$$

As long as the difference $\Delta$ and the width W falls within the ranges specified by formulas (12), it may suffice to use phosphoric acid or sulfuric acid as etchant in forming the ridge section 110, since the use of either acid renders it possible to control the etching with high accuracy.

It is required that the aluminum composition ratio of the P type $In_{0.5}(Ga_{1-y}Al_y)_{0.5}P$ second cladding layer 108a is 0.5 or more ($y \leq 0.5$) in order to provide a potential barrier high enough to confine carriers within the active layer 106. Hence, the second cladding layer 108a has an aluminum composition ratio of 0.5 or more (i.e., $y \leq 0.5$).

FIG. 6 is a graph representing how the rate at which an InGaAlP layers is etched with sulfuric acid depends on the aluminum composition ratio of the InGaAlP layer. As this graph clearly shows, the etching rate exhibits a great dependency on the aluminum composition ratio. More precisely, the etching rate decreases exponentially with the aluminum composition ratio. This is also true for the rate at which an InGaAlP layer is etched with phosphoric acid. Therefore, when the P type $In_{0.5}(Ga_{1-x}Al_x)_{0.5}P$ optical guide layer 112 has an aluminum composition ratio of less than 0.3 ($x \leq 0.3$), the etching rate of this layer 112 is much lower than that of the $In_{0.5}(Ga_{1-y}Al_y)_{0.5}P$ second cladding layer 108a. Consequently, the second cladding layer 108 is "side-etched," making it impossible to shape the ridge section 110 with sufficient precision. It is therefore necessary to set the aluminum composition ratio of the optical guide layer 112 at a value greater than 0.3 (i.e., $x > 0.3$) so that the ridge section 110 can have a desired shape.

It should be noted that the N type GaAlAs buried layers 114 of the laser 100 (FIG. 3) have their top surface exposed to an oxygen-containing atmosphere immediately after they have been formed. Inevitably, an oxide film is formed on the top surface of either N type buried layer 114. The thickness of this oxide film is proportionate to the period of time the top surface of the layer 114 is exposed to the oxygen-containing atmosphere. If this period of time is tens of minutes, as in the growth of crystal actually performed, a thick oxide film will be formed, impairing the crystalline quality of the contact layer 116. More specifically, the inventors hereof conducted experiments, wherein GaAlAs buried layers having different aluminum mole fractions were formed, and then the surface morphology of the contact layer 116 was evaluated. The results were: the greater the aluminum composition ratio, the more serious the deterioration of the contact layer 116. In particular, the buried layers had an aluminum composition ratio of 0.8 or more, and the surface of contact layer 116 was far from desired, probably because the oxide films formed on the buried layers were considerably thick. The worse the surface of layer grown, the more crystal defects the contact layer 116 has. As a semiconductor laser having GaAs contact layer having many crystal defects operated for a long time, crystal defects will develop. If the crystal defects develop into the active layer 106 of the laser, they will cause poor behavior, degrading the physical properties of the laser. In view of this, to maximize the operating reliability of the laser 100, it is preferable that the GaAlAs buried layers 114 have an aluminum composition ratio not exceeding 0.08, preferably 0.75 or less.

The laser 100 shown in FIG. 3 may be modified into two ones illustrated in FIG. 8 and FIG. 9, respectively. The some of the components of either modified laser, which are identical to those shown in FIG. 3, are designated by the same reference numerals and will not be described in detail.

The laser 130 shown in FIG. 7 is characterized in that an intermediate-bandgap layer 132 is interposed between the upper second cladding layer 108b and the contact layer 116. This layer 132 is a P type $Ga_{0.5}Al_{0.5}As$ layer having a bandgap which is intermediate between those of the layers 108b and 116. This is why the layer 132 is called "intermediate-bandgap layer." Rather, the layer 132 may better be called "current-supply facilitating layer" since it facilitates the supply of a current to the laser 130. The aluminum composition ratio of the layer 116 may be increased from 0.5 to 0.6. In other words, the layer 132 may be made of P type $Ga_{0.4}Al_{0.6}As$, in which case the laser 130 will function as a transverse-mode controlled laser device having a low value of operating voltage.

The laser 140 shown in FIG. 8 is characterized in that a current-supply facilitating layer 142 is interposed between the contact layer 116, on the one hand, the upper second cladding layer 108b, the N type $Ga_{0.45}Al_{0.55}As$ buried layers 114, on the other hand. The layer 142 has a P type $Ga_{0.5}Al_{0.5}As$ layer having a bandgap intermediate between that of the contact layer 116 and that of the layer 108b. Alternatively, the current-supply facilitating layer 142 may be a P type $Ga_{0.4}Al_{0.6}As$ layer having a bandgap intermediate between that of the contact layer 116 and that of the layer 108b.

It should be noted that in the embodiment of FIG. 3, the upper second cladding layer 108b may be replaced with a GaAlAs layer. In this case, it is necessary to form the second cladding layer 108b of substantially the same composition as the N type $Ga_{0.45}Al_{0.55}As$ buried layers 114, in order to have the same refractive index as the layers 114. That is, the layer 108b must be a P type $Ga_{0.45}Al_{0.55}As$ layer or a P type $Ga_{0.4}Al_{0.6}As$ layer. The P type GaAlAs layer can have resistivity ranging from 0.1 to 1.2 ohm-centimeters, which is one or more orders of magnitude less than the resistivity of the second cladding layer made of P type InGaAlP. The inventors made a laser comprising a layer 108b made of said specific GaAlAs composition, which exhibited an oscillation-operating voltage reduction of as low as 0.3 volts.

Figure 9A:
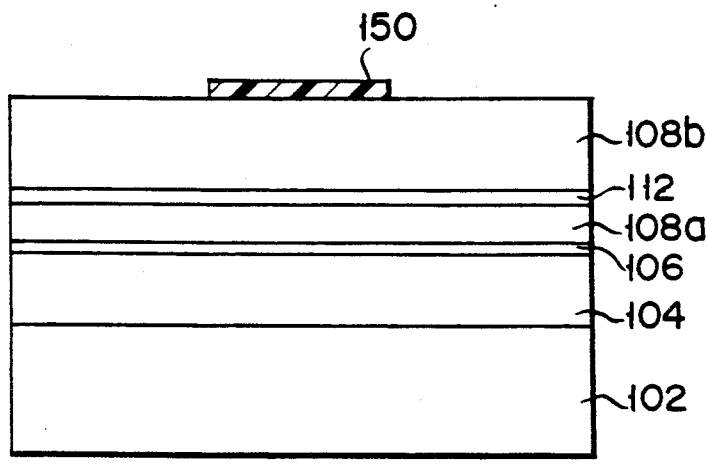
FIGS. 9A to 9C to diagrams showing, in schematic cross-section, some of the major steps of manufacturing the laser structure shown in FIG. 3.
Figure 9B:
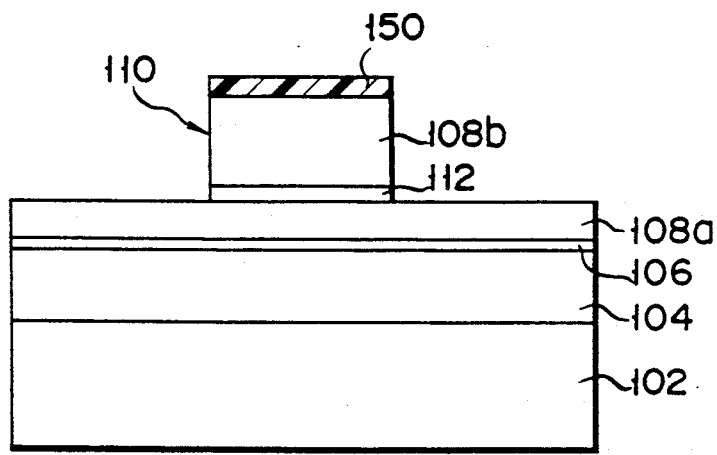
Figure 9C:
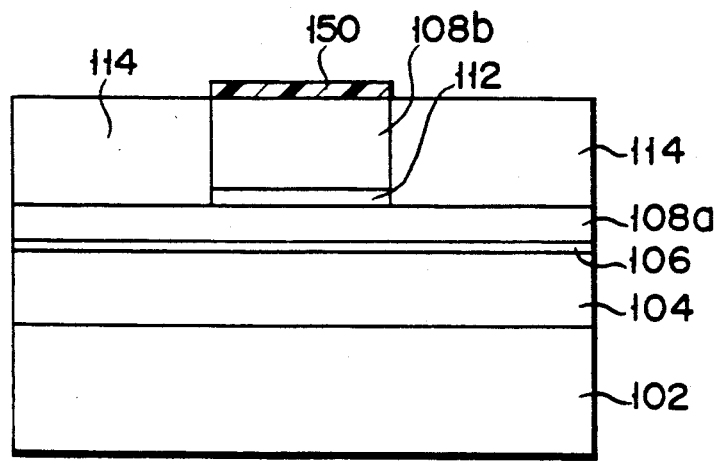

A semiconductor laser having the structure shown in FIG. 3 was manufactured. With reference to FIGS. 9A to 9C it will now be explained how this laser was manufactured.

First, an N type GaAs substrate 102 was prepared. Then, a first cladding layer 104 was formed on the upper surface of the substrate 102. Further, an active layer 106 was formed on the first cladding layer 104, a lower second cladding layer 108a was formed on the active layer 106, a optical guide layer 112 was formed on the lower second cladding layer 108a, and an upper second cladding layer 108b was formed on the optical guide layer 112. The layers 104, 106, 108a and 108b, and 112 were formed by means crystal growth, more precisely by means of reduced-pressure metal organic chemical vapor deposition (MOCVD method). They had the compositions and thicknesses as specified above.

Then, as is shown in FIG. 9A, a thin $Si_3N_4$ film 150, having a thickness of typically 100 nanometers, was deposited on the top surface of the resultant laminated structure. The thin film 150 was patterned, thus having a width equal to the width W of a ridge section 110 which would be later formed.

Next, the laminated structure was subjected to selective etching, wherein the patterned thin film 150 was used as a mask. As a result, the layers 108b and 112 were etched, forming a ridge section 110, as is illustrated in FIG. 9B. (If the substrate 102 has had crystal axis (100) and the stripe-shaped mask 150 has been aligned with crystal axis (011), the ridge section 110 should have been shaped like an inverted mesa. In this case, the lower end of the ridge section 110, which was located near the active layer 106, could have a small width W.)

Thereafter, the structure was subjected to selective crystal growth, such as reduced-pressure metal organic chemical vapor deposition, by using the stripeshaped mask film 150, thereby forming buried layers 114 as is illustrated in FIG. 9C. The buried layers 114 were $Ga_{0.45}Al_{0.55}As$ layers doped with silicon to a concentration of about $1 \times 10^{17}$ atoms per cubic centimeter. They were formed by crystal growth, at 700° C. at pressure of 75 Torr. During the crystal growth performed under these conditions, the mask film 150 was not buried in the growing $Ga_{0.45}Al_{0.55}As$ layers.

Further, the mask film 150 was removed from the structure shown in FIG. 9C by the known etching process. Then, a P type GaAs contact layer 116 doped with Zn was formed on the entire top surface of the resultant structure by means of MOCVD method. At last, metal layers 118 and 120 were formed on the lower surface of the substrate 102 and the contact layer 116. As a result, a red-light emitting InGaAlP laser 100 was manufactured, as is illustrated in FIG. 3.

Also, the inventors hereof made semiconductor lasers of the structure shown in FIG. 3 by the same method as described above, each having $Ga_{1-x}Al_xAs$ buried layers 114 having a different aluminum composition ratio x falling in the range of $0 < x < 1$. It was found that the lattice constant of the buried layers 114 depended but very little on the aluminum composition ratio. Therefore, no lattice mismatch occurred, and hence, no dislocation took place, whereby high-quality $Ga_{1-x}Al_xAs$ crystal grew on the sides of the ridge section 110.

In the method of manufacturing the laser 100 shown in FIG. 3, it is desirable that the buried layers 114 be formed only on the sides of the ridge section 110, not on the top surface of the mask layer 150. Once $Ga_{1-x}Al_xAs$ is deposited on the mask film 150, it is difficult to remove it from the mask film 150. The amount of $Ga_{1-x}Al_xAs$ which may deposited on the mask film 150 seems proportional to the aluminum composition ratio x of $Ga_{1-x}Al_xAs$. In order to ascertain this, the inventors carried out experiments, in which buried GaAs layers having a thickness of 0.5 micrometers were formed, and $Ga_{1-x}Al_xAs$ layers having a thickness of 0.5 micrometers and various aluminum mole fractions were formed, and the top surfaces of the mask films were examined after these layers had been formed. The results are as shown in the following Table:

TABLE

| Aluminum Mixture Ratio (x) | Composition | Deposition on Mask Layer |
|---|---|---|
| 0 | GaAs | Never |
| 0.5 | $Ga_{0.5}Al_{0.5}As$ | Never |
| 0.7 | $Ga_{0.3}Al_{0.7}As$ | Never |
| 0.75 | $Ga_{0.25}Al_{0.75}As$ | Partially |
| 0.8 | $Ga_{0.2}Al_{0.8}As$ | Fully |

This table reveals that the selective growth of buried layers 114 will be much impaired if the aluminum composition ratio is greater than 0.75. Hence, the inventors made lasers which had the structure shown in FIG. 3 and comprised buried layers having an aluminum composition ratio of less than 0.75. These lasers turned out to be red-light emitting, transverse-mode stabilized lasers. As is evident from the table, GaAlAs was partially deposited on the mask film in the structure which comprised buried layers having an aluminum composition ratio of 0.75. However, the GaAlAs could easily be removed from the mask film by means of the existing etching techniques. Therefore, the table demonstrates that an absolute requirement for manufacturing red-light emitting, transverse-mode stabilized lasers is to form GaAlAs buried layers having an aluminum composition ratio of 0.75 or less. This requirement also satisfies the formulas (7) and (7').

Figure 10:
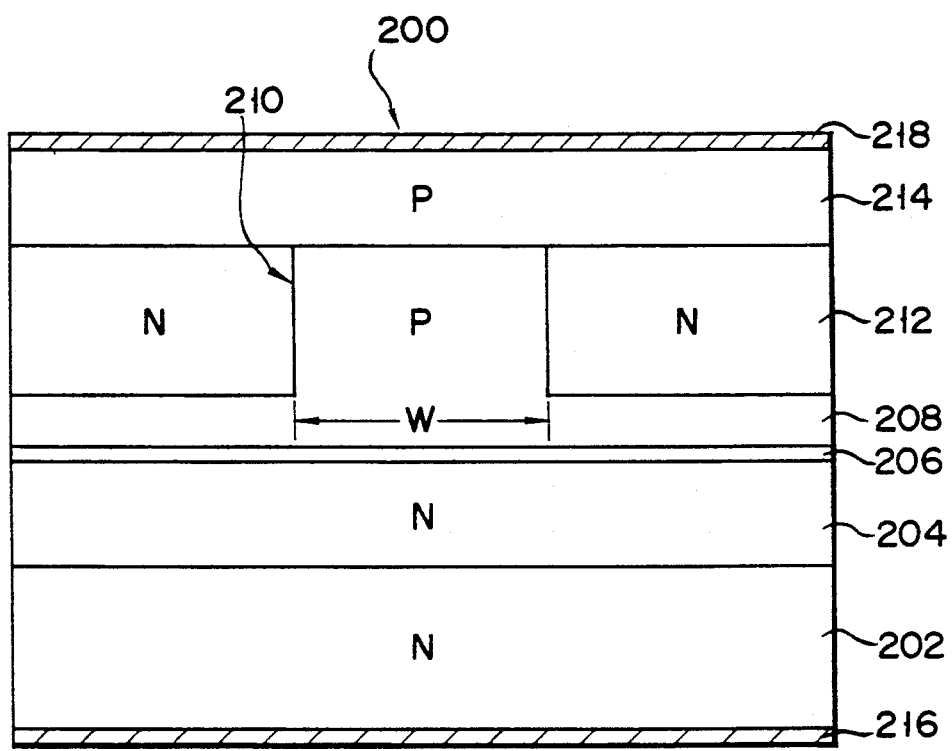
FIG. 10 is a sectional view schematically showing an InGaAlP semiconductor laser according to a third embodiment of the present invention.

FIG. 10 is a sectional view illustrating the main part of a semiconductor laser 200 (not drawn to scale) which is a third embodiment of the invention. As FIG. 10 clearly shows, the laser 200 has a GaAs substrate 202 of N conductivity type. It further comprises a first cladding layer 204, an active layer 206, and a second cladding layer 208. The first cladding layer 204, which is made of N type $In_{0.5}(Ga_{0.3}Al_{0.7})_{0.5}P$, is formed on the upper surface of the substrate 202, has a thickness of typically 1 micrometer, and has a donor concentration of $4 \times 10^{17}$ atoms per cubic centimeter. The active layer 206, which is made of non-doped $In_{0.5}Ga_{0.5}P$, is formed on the first cladding layer 204 and has a thickness of typically 0.06 micrometers. The second cladding layer 208, which is made of P type $In_{0.5}(Ga_{0.3}Al_{0.7})_{0.5}P$, is formed on the active layer 206 and has a thickness of typically 1 micrometer and a donor concentration of $5 \times 10^{17}$ atoms per cubic centimeter.

As is shown in FIG. 10, the second cladding layer 208 is etched, forming a stripe-shaped ridge section 210 on its center portion. The ridge section 210 has a height of 0.8 micrometers. Therefore, the remaining portion of the layer 208, i.e., the thin portion, has a thickness of 0.2 micrometers.

Two buried layers 212 are formed on the top surface of the thin portion of the second cladding layer 208 and contact the opposing sides of the ridge section 210, respectively. These buried layers 212 are of the conductivity type opposite to that of the second cladding layer 208, and constitute a current-blocking layer 212. The layers 212 are, for example, N type $Ga_{0.35}Al_{0.65}As$ layers having a thickness of typically 0.8 micrometers and a donor concentration of $1 \times 10^{17}$ atoms per cubic centimeter. The top surfaces of the buried layers 212 are at the same level as that of the ridge section 210.

A contact layer 214 is formed on the top surface of the ridge section 20 and also the top surfaces of the buried layers 212. The contact layer 214 is made of P type GaAs, has a thickness of typically 2 micrometers, and has an acceptor concentration of $2 \times 10^{18}$ atoms per cubic centimeter. A metal layer 216 is formed on the lower surface of the semiconductor substrate 202, and functions as an N-side electrode. A metal layer 218 is formed on the contact layer 214, and functions as a P-side electrode.

It should be noted that the aluminum composition ratio of the second cladding layer 208 is of such a value that the layer 208 has a refractive index greater than that of the buried layers 212.

The inventors hereof manufactured a laser having the structure shown in FIG. 10, and evaluated the operating characteristics of the laser thus made. They found that the difference $\Delta n$ in effective refractive index between the ridge section 210 and outside the ridge portion was $3 \times 10^{-3}$. This value is sufficiently great. The width W of the ridge section 210 was less than 2 micrometers, and the laser performed a stable transverse-mode oscillation, emitting a beam having a small aspect ratio of less than 3. In addition, the astigmatism was much suppressed, to 5 micrometers or less. Since the buried layers 212 had the conductivity type opposite to that of the ridge section 210, they could function as a current-blocking layer. Since the layers 212 served as a current-blocking layer, the laser 200 maintained an oscillation threshold value as small as 30 mA or less.

With reference to FIGS. 11A to 11C it will now be explained how the laser 200 of the structure shown in FIG. 10 was manufactured.

First, an N type GaAs substrate 202 was prepared. Then, a first cladding layer 204 was formed on the upper surface of the substrate 202. Further, an active layer 206 was formed on the first cladding layer 204, and a second cladding layer 208 was formed on the active layer 206. The layers 204, 206, and 208 were formed by means of crystal growth, more precisey MOCVD method. They had the compositions and thicknesses as specified above.

Then, as is shown in FIG. 11A, a thin $Si_3N_4$ film 220, having a thickness of typically about 100 nanometers, was deposited on the top surface of the resultant laminated structure. The thin film 220 was patterned, thus having a width equal to the width W of a ridge section 210 which would be later formed.

Next, the laminated structure was subjected to selective etching, wherein the patterned thin film 220 was used as a mask. As a result, the layer 208 was etched, forming a ridge section 210 and a thin portion having a thickness of about 0.2 micrometers, as is illustrated in FIG. 11B. (If the substrate 202 and the stripe-shaped mask 220 have had crystal axis (100) and crystal axis (011), the ridge section 210 should have been shaped like an inverted mesa. In this case, the lower end of the ridge section 210, which was located near the active layer 206, could have a small width W.)

Thereafter, the structure was subjected to selective crystal growth, such as MOCVD method, by using the stripe-shaped mask film 220, thereby forming buried layers 212 as is illustrated in FIG. 11C. The buried layers 212 were $Ga_{0.35}Al_{0.65}As$ layers doped with silicon to a concentration of about $1 \times 10^{17}$ atoms per cubic centimeter. They were formed by crystal growth, at 700° C. at pressure of 75 Torr. During the crystal growth performed under these conditions, the mask film 220 was not buried in the growing $Ga_{0.35}Al_{0.65}As$ layers.

Thereafter, the mask film 220 was removed from the structure shown in FIG. 11C by the known etching process. Then, a P type GaAs contact layer 214 was formed on the entire top surface of the resultant structure by means of MOCVD method. At last, metal layers 216 and 218 were formed on the lower surface of the substrate 202 and the contact layer 214. As a result, a red-light emitting InGaAlP laser 200 was manufactured, as is illustrated in FIG. 10.

FIG. 12 is a sectional view illustrating the main part of a semiconductor laser 300 (not drawn to scale) which is the fourth embodiment of the invention. As is clearly shown in FIG. 12, the laser 300 has an N type GaAs substrate 302. Sequentially formed on this substrate 302 are a first conductivity type cladding layer 304, an active layer 306, and a second conductivity type cladding layer 308 are formed sequentially. Cladding layer 304 may be an N type $In_{0.5}(Ga_{0.3}Al_{0.7})_{0.5}P$ layer which is formed to typically 1 micrometer thickness, having a donor concentration of $4 \times 10^{17}$ atoms per cubic centimeter; active layer 306 is an non-doped $In_{0.5}Ga_{0.5}P$ layer of typically 0.06 micrometers; cladding layer 308 is a P type $In_{0.5}(Ga_{0.3}Al_{0.7})_{0.5}P$ layer formed to be typically 0.2 micrometers thick, having an acceptor concentration centration of $5 \times 10^{17}$ atoms per cubic centimeter.

As is shown in FIG. 12, a third cladding layer 310, which is made of N type $In_{0.5}Al_{0.5}P$, is formed on the second cladding layer 308. The third cladding layer 310 has a stripe-shaped groove 312 (hereinafter called "stripe-groove section"). It has a thickness of typically 0.6 micrometers and a donor concentration of $4 \times 10^{17}$ atoms per cubic centimeter.

An optical guide layer 314 is formed on the third cladding layer 310, including the stripe-groove section 312. The layer 314 is a P type $Ga_{0.4}Al_{0.6}As$ thin film having a thickness of 0.15 micrometers and an acceptor concentration of $2 \times 10^{18}$ atoms per cubic centimeter. A fourth cladding layer 316, which is made of P type $Ga_{0.3}Al_{0.7}As$, is formed on the optical guide layer 314, filling the stripe-groove section 312. The fourth cladding layer 316 is relatively thick, having a thickness of typically 1 micrometer, and has an acceptor concentration of $2 \times 10^{18}$ atoms per cubic centimeter.

A contact layer 318 is formed on the top surface of the fourth cladding layer 316. The contact layer 318 is made of P type GaAs, has a thickness of typically 2 micrometers, and has an acceptor concentration of $2 \times 10^{18}$ atoms per cubic centimeter. A metal layer 320 is formed on the lower surface of the semiconductor substrate 302, and functions as an N-side electrode. A metal layer 322 is formed on the contact layer 318, and functions as a P-side electrode.

The laser 300 illustrated in FIG. 12 is characterized in that the optical guide layer 314 has a refractive index greater than that of the third cladding layer 310 of N type. Therefore, the layer 314 has an aluminum mixture ratio of 0.6, whereas the third cladding layer 310 has an aluminum mixture ratio of 1.0 (i.e., $In_{0.5}(Ga0.0Al_{1.0})_{0.5}P$). These specific values satisfy the formulas (7) and (7').

The inventors manufactured a laser having the structure shown in FIG. 12, and evaluated the operating characteristics of the laser thus made. They found that the difference $\Delta n$ in effective refractive index between the stripe-groove section 312 the layer section outside the stripe-groove portion was sufficiently great. More specifically, the difference was:

$$\Delta n > 5 \times 10^3 \qquad (14)$$

Owing to this great difference $\Delta$, the laser could performed stabilized transverse-mode oscillation. The width W of the stripe-groove section 312 was 2 micrometers or less, and the laser performed a stable fundamental transverse-mode oscillation, emitting a beam having a small aspect ratio of 1.5 or less. In addition, astigmatism was greatly suppressed, to 5 micrometers or less.

The valence band at the heterojunction between the cladding layer 308, made of P type $In_{0.5}(Ga_{1-z}Al_z)_{0.5}P$, and the optical guide layer, made of P type $Ga_{1-v}Al_vAs$, is discontinuous. This band discontinuity acts as a barrier to holes, inevitably causing a voltage drop and, hence, increasing the operating voltage of the laser 300. The smaller the aluminum composition ratio of the cladding layer 308, and the greater the aluminum composition ratio of the optical guide layer, the less prominent the discontinuity of the valence band.

Figure 13A:
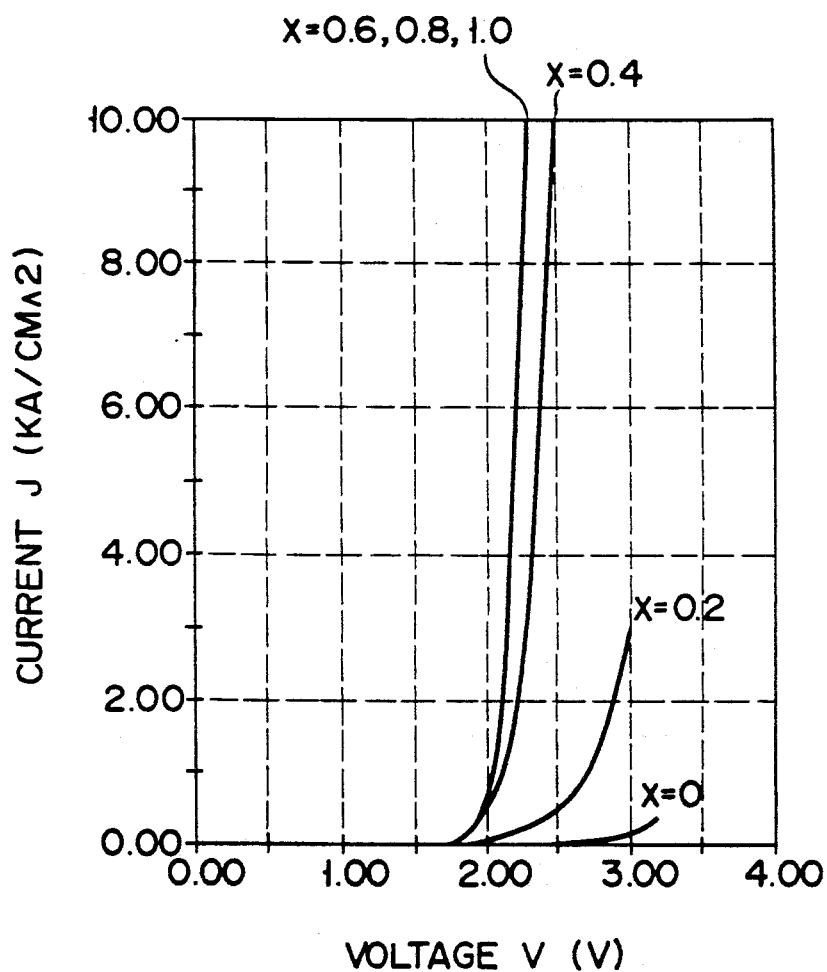
FIGS. 13A and 13B are graphs representing the current-voltage characteristics of the laser shown in FIG. 12.

The cladding layer 308, made of P type $In_{0.5}(Ga_{1-z}Al_z)_{0.5}P$, must have an aluminum composition ratio z of 0.5 or more. It would otherwise fail to provide a potential barrier strong enough to confine carriers. The inventors manufactured semiconductor lasers, each comprising cladding layer 308, made of P type $In_{0.5}(Ga_{0.5}Al_{0.5})_{0.5}P$, and a P type $Ga_{1-v}Al_vAs$ optical guide layer having a different aluminum composition ratio v. Then, they evaluated the current-voltage characteristics of these lasers. The results were as is shown in FIG. 13A. As is evident from FIG. 13A, the laser can have a sufficiently low operating voltage when the $Ga_{1-v}Al_vAs$ optical guide layer 314 has an aluminum composition ratio v of 0.4 or more. Therefore, in order to have good current-voltage characteristic, a laser comprising cladding layer 308, made of P type $In_{0.5}(Ga_{0.5}Al_{0.5})_{0.5}P$, must have a P type $Ga_{1-v}Al_vAs$ optical guide layer 314 which has an aluminum composition ratio of v 0.4 or more.

Figure 13B:
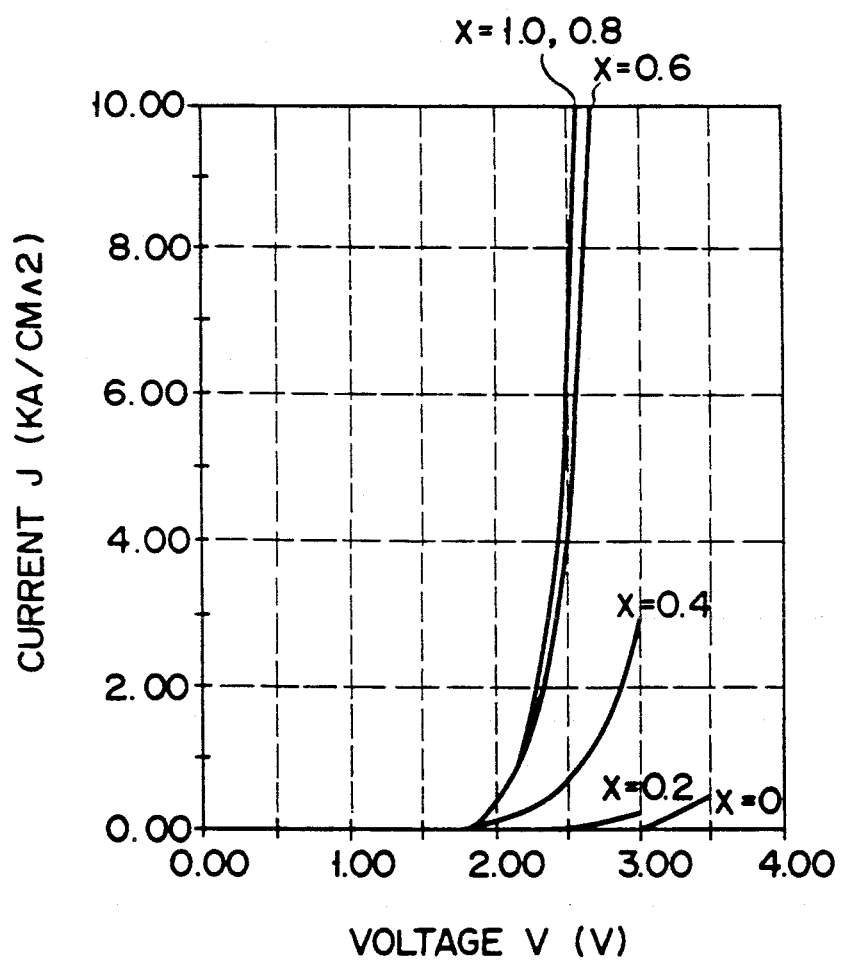

The inventors made semiconductor lasers having the structure shown in FIG. 12, each comprising the cladding layer made of P type $In_{0.5}(Ga_{0.3}Al_{0.7})_{0.5}P$, and a P type $Ga_{1-v}Al_vAs$ optical guide layer having a different aluminum composition ratio v. Then, they evaluated the current-voltage characteristics of these lasers. The results were as is shown in FIG. 13B. As is evident from FIG. 13B, a laser having the structure of FIG. 7 can have a sufficiently low operating voltage when the P type $Ga_{1-v}Al_vAs$ optical guide layer 314 has an aluminum composition ratio v of 0.6 or more. In fact, the laser whose P type $Ga_{1-v}Al_vAs$ optical guide layer had an aluminum composition ratio v of 0.6 could be driven by 2.5 V or less when the input current J was to 2 $kA/cm^2$.

In addition, since the P type $Ga_{0.4}Al_{0.6}As$ optical guide layer 314 and the P type $Ga_{0.3}Al_{0.7}As$ cladding layer 316 had a resistivity of 0.1 to 0.2 ohm-cm, which is one order of magnitude less than the resistivity of the P type InGaAlP layers, the operating voltage of the laser was about 0.3 volts lower than that of the conventional laser having P type InGaAlP optical guide layer, when the input current was nearly equal to the oscillation threshold value.

The inventors made semiconductor lasers, each comprising P type $Ga_{0.3}Al_{0.7}As$ cladding layer 316 and N type $In_{0.5}Al_{0.5}P$ cladding layer 310. The layer 316 had an aluminum composition ratio of 0.7 so as to have substantially the same refractive index as the cladding layer 310. As a result, a difference in effective refractive index, which was great enough to stabilize the transverse-mode oscillation, was secured.

The amount of heat, which the laser radiated while operating at high current density to output high-power beam, was minimized, and the laser could generate a CW optical output of 20 mW or more, without a decrease in the differential quantum efficiency.

Further, in this laser, the third cladding layer 310, which is made of N type $In_{0.5}Al_{0.5}P$, functioned as a current-blocking layer, allowing a current to flow through the stripe-shaped section only. Therefore, the laser exhibited an oscillation current threshold value as small as 30 mA or less.

Figure 14:
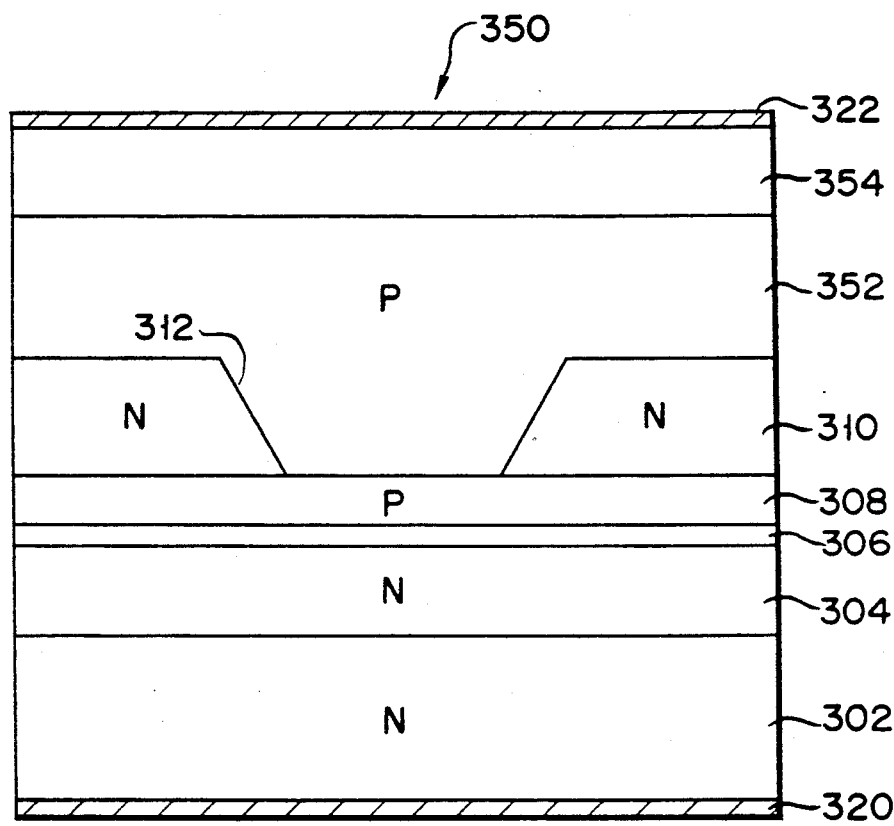
FIG. 14 is a sectional view illustrating a modification of the laser shown in FIG. 12.

The laser 300 of FIG. 12 may be modified as shown in FIG. 14, wherein some of the components of the modified laser 350, which are identical to those shown in FIG. 12, are designated by the same reference numerals and will not be described in detail, only for the purpose of simplification of description.

An optical guide layer 352 is formed on an N type cladding layer 310 having a stripe-groove section 312, filling the stripe-groove section 312. The layer 352 is relatively thick, and its top surface is flat. It is made of P type $Ga_{0.35}Al_{0.65}As$, which has a thickness of 1.2 micrometers, and an acceptor concentration of $2 \times 10^{18}$ atoms per cubic centimeter. A contact layer 354 is formed on the top surface of the optical guide layer 352. The layer 354 has a thickness of typically 1.2 micrometers and an acceptor concentration of $2 \times 10^{18}$ atoms per cubic centimeter. A P type layer 322 is formed on the contact layer 354.

With the laser 350, its refraction section of the optical guide layer 352 has a refractive index greater than that of the cladding layer 310. In order to attain the numerical setup, the aluminum composition ratio of the optical guide layer 352 is set at 0.65, while that of the cladding layer 310 is 1.0 (i.e., $In_{0.5}(Ga_{0.0}Al_{1.0})_{0.5}P$). Of course values satisfy the formulas (7) and (7').

The inventors manufactured a laser having the structure shown in FIG. 14, and evaluated the operating characteristics of the laser thus made. They found that the difference $\Delta n$ in effective refractive index between the stripe-groove section 312 and layer section positioned outside the stripe-groove section 312 is sufficiently great. More specifically, the difference was:

$$\Delta n > 1 \times 10^{-3} \qquad (15)$$

Owing to this great difference, the laser could performed stable transverse-mode oscillation. The width W of the stripe-groove section 312 was less than 2 micrometers or less, and the laser performed a stable fundamental transverse-mode oscillation, emitting a beam having a small aspect ratio of 2.5 or less. In addition, astigmatism was greatly suppressed, to 5 micrometers or less.

The inventors found that since the optical guide layer 352 was made of P type $Ga_{0.35}Al_{0.65}As$, the laser 350 could be efficiently driven with a low voltage of 2.5 volts or less when the input current J was to 2 kiloamperes per square centimeter. The laser 350 could generate a CW optical output of 20 mW or more, without a decrease in the differential quantum efficiency. Further, since the cladding layer 310 was made of N type $In_{0.5}Al_{0.5}P$, the laser 350 exhibited an oscillation threshold value as small as 30 milliamperes or less.

A semiconductor laser device in accordance with the fifth embodiment of the invention is generally designated by "400" in FIG. 15 (not drawn to scale). As is clearly shown in FIG. 15, the laser 400 has a GaAs substrate 402 of N type. It further comprises a cladding layer 404, an optical guide layer 406, an active layer 408, and a cladding layer 410. The cladding layer 404, which is made of N type $In_{0.5}(Ga_{0.3}Al_{0.7})_{0.5}P$, is formed on the upper surface of the substrate 402, has a thickness of typically 1 micrometer, and has a donor concentration of $4 \times 10^{17}$ atoms per cubic centimeter. The optical guide layer 406, made of N type $In_{0.5}(Ga_{0.5}Al_{0.5})_{0.5}P$, is formed on the cladding layer 404, has a thickness of typically of 0.5 micrometer, and has an acceptor concentration of $4 \times 10^{17}$ atoms per cubic centimeter. The active layer 408, which is made of non-doped $In_{0.5}Ga_{0.5}P$, is formed on the optical guide layer 406, and has a thickness of typically 0.06 micrometers. The cladding layer 410, which is made of P type $In_{0.5}(Ga_{0.3}Al_{0.7})_{0.5}P$, is formed on the active layer 408 and has a thickness of typically 0.8 micrometers and an acceptor concentration of $5 \times 10^{17}$ atoms per cubic centimeter. These layers 404, 406, 408, and 410 compose a double-heterojunction.

The laser 400 further comprises a current-blocking layer 412 formed on the P type cladding layer 410, and a contact layer 416 formed on the current-blocking layer 412. The current-blocking layer 412 is made of N type GaAs, has a thickness of 0.7 micrometers, and a donor concentration of $2 \times 10^{18}$ atoms per cubic centimeter. The layer 412 has a stripe-shaped groove 414 (hereinafter referred to as "stripe-groove section"). The contact layer 416 fills the stripe-groove section 414 of the current-blocking layer 412. It is made of P type GaAs, has a thickness of 3 micrometers, and an acceptor concentration of $2 \times 10^{18}$ atoms per cubic centimeter.

Further, a metal layer 418 is formed on the lower surface of the substrate 402, and functions as an N-side electrode. A metal layer 420 is formed on the contact layer 416, and functions as a P-side electrode.

The inventors hereof made semiconductor lasers having the structure shown in FIG. 15, and evaluated the characteristics of these lasers. Since the optical guide layer 406, which contacted the active layer 408, had a refractive index greater than those of the cladding layers 404 and 410, the oscillated laser light was guided mainly through the optical guide layer 406. The density of light in the active layer 408 was about 40% less than that of the ordinary double hetero-junction which has no optical guide layers. The catastrophic optical damage (COD) of these lasers was about 1.6 times greater than that of the conventional lasers having the ordinary double heterojunction.

In the fifth embodiment (FIG. 15), light has tendency of leaking from the active layer 408 through the optical guide layer 406 and farther into the N type cladding layer 404. To minimize the loss due to the light absorption in the substrate 402, it is required that the total thickness of the layers 404 and 406 be 1.5 micrometers or more. However, the N type InGaAlP layers 404 and 406 have resistivity which was about 10% of that of the P type InGaAlP layer 410. Hence, even if the layers 404 and 406 are 1.5 micrometers or more thick, the series resistance of the device due to these N type layers is negligible low, or far from causing a reduction in the maximum oscillation temperature. In addition, the bandgap difference between the active layer 408 and the optical guide layer 406 is sufficiently great to confine carriers; there is no risk that the maximum oscillation temperature of the laser 400 is lower. In fact, the lasers having the structure shown in FIG. 15 exhibited the maximum oscillation temperature of 70° C. or more. This value is sufficient in practice.

The more light leaks from the active layer 408 into the underlying N type cladding layer 404, the less light leaks from the active layer 408 into the overlying P type cladding layer 410. Therefore, even if the active layer 408 is made thinner (for example, 0.04 micrometers), the P type INGaAlP cladding layer 408 which is higher in resistivity than N type InGaAlP layer need not be made thicker. Hence, even if the active layer 408 is thin, the optical output characteristic of the laser 400 can be sufficient without degrading the temperature characteristics thereof.

The laser 400 shown in FIG. 15 may be modified into the laser 430 shown in FIG. 16, which is a transverse-mode stabilized laser having a stripe-shaped ridge. Some of the layers of laser 430 are identical to those shown in FIG. 15, and have the same reference numerals and will not be described in detail.

The laser 430 is characterized in that a cladding layer 432, which is made of P type $In_{0.5}(Ga_{0.3}Al_{0.7})_{0.5}P$, is formed on a P type cladding layer 408. The P type cladding layer 432 has a thickness of typically 0.8 micrometers and an acceptor concentration of $4 \times 10^{17}$ atoms per cubic centimeter. The layer 432 has been etched, and consisting of flat side portions and a mesa-shaped center portion 434 (hereinafter called "ridge section"). The side portions have a thickness of about 0.2 micrometers.

Two current-blocking layers 436, both made of N type GaAs, are formed on the left side portion of the layer 432 and the left slope of the ridge section 434, and on the right side portion of the layer 432 and the right slope of the ridge section 434, respectively. Both current-blocking layers 436 have a thickness of 1 micrometer and a donor concentration of $2 \times 10^{18}$ atoms per cubic centimeter. A contact layer 416 and two metal layers 418 and 420 are formed in the same way as in the laser 400 (FIG. 15).

The applicants manufactured lasers having the structure shown in FIG. 16, and evaluated the characteristics of these lasers. These lasers exhibited an COD output of about 1.5 times greater than that of the conventional lasers having the ordinary double heterostructure, and produced a maximum output of 20 mw or more. Further, they exhibited the maximum oscillation temperature of 80° C. or more.

In the laser 430 having the stripe-shaped ridge section 434, too, the current-blocking layers 436 are formed above the N type substrate 402 so as to have the N type conductivity type, for the following reason. Within the N type GaAs layer, the diffusion length of minority carriers (holes, in this case) generated by the light absorbed therein is less than the thickness of the current blocking layer. Hence, no minority carriers move from the current-blocking layers 436, and the voltage applied on these layers remains sufficiently high, whereby the layers 436 can block a current to a desired degree. The oscillation current is confined in the ridge section 434 composed of P type cladding layer 432 having a resistivity higher than that of the corresponding cladding layer incorporated in the conventional lasers. The fact that the light density in the optical guide layer 406 formed on the N type cladding layer 404 reduces the light density in the active layer 408, without increasing the thickness of the P type cladding layers 432, greatly serves to improve the temperature characteristic and to produce a great output.

Two regions having high carrier concentration, which have a thickness of 40 to 80 nanometers and a carrier concentration of $5 \times 10^{17}$, may be formed between those portions of the P type InGaAlP cladding layer 432 and contact the P type GaAs layer 416. If this is the case, the ohmic contact between the P type cladding layers 432, on the one hand, and the P type contact layer 416, on the other, can be improved. With such an arrangement, it is possible to prevent an undesirable rise of the operation voltage of the laser and a degradation of the thermal characteristic thereof.

Figure 17:
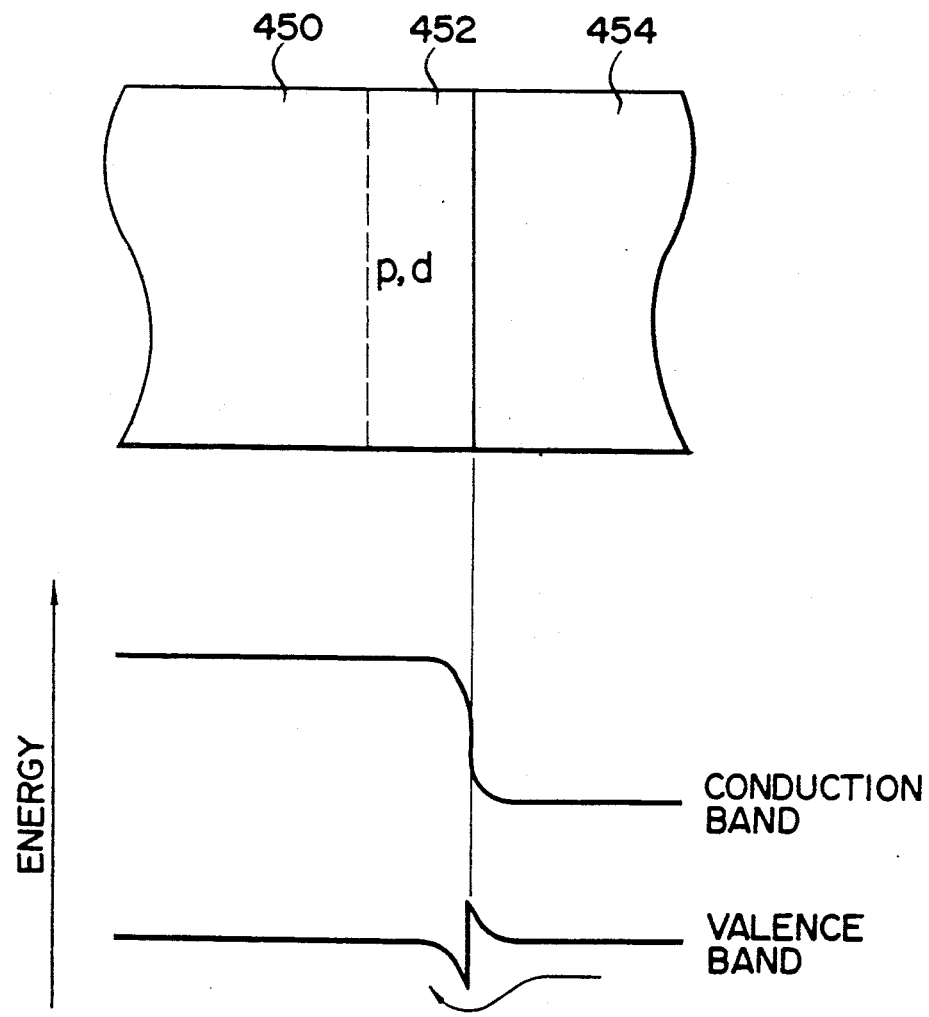
FIG. 17 is a diagram for explaining the basic concept of a semiconductor laser according to a seventh embodiment of the present invention.
Figure 18:
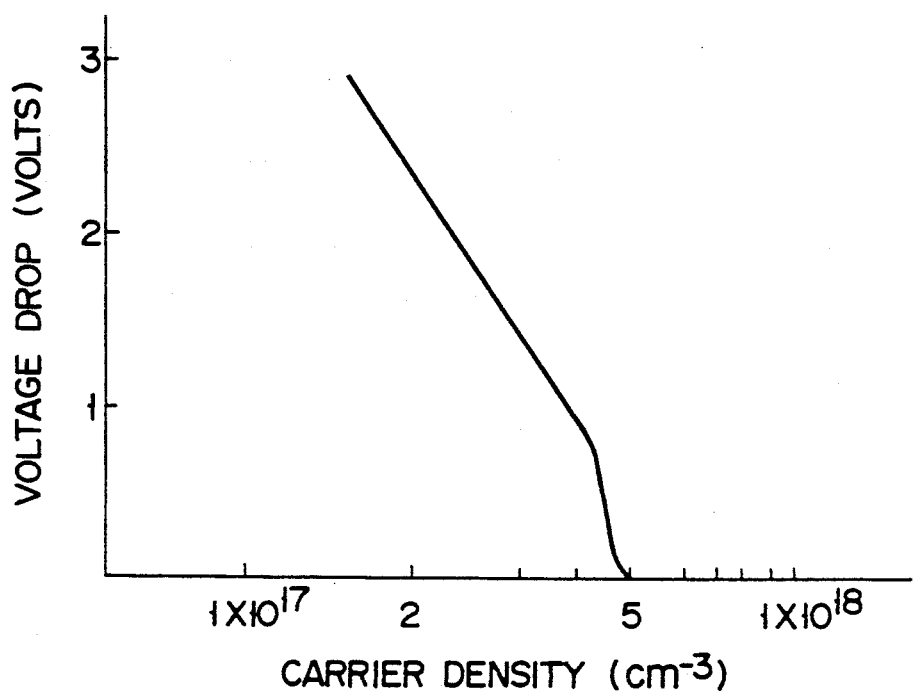
FIGS. 18 and 19 are graphs showing the voltage-drop characteristics of the laser shown in FIG. 17.
Figure 19:
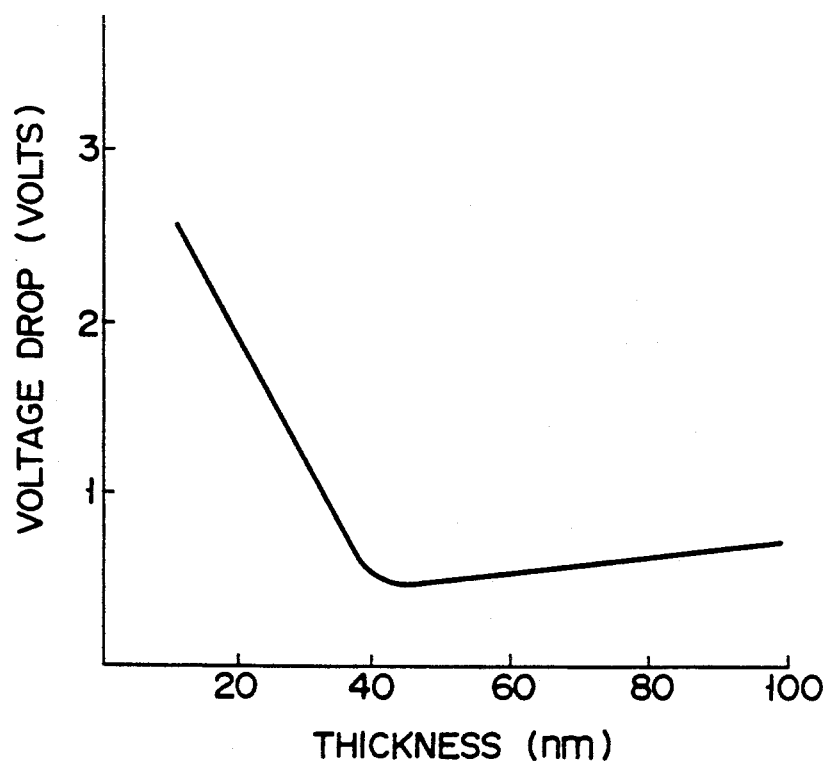

The high carrier concentration regions will be analyzed, with reference to FIGS. 17, 18 and 19. In FIG. 17, numeral "450" designates an $In_{1-x-y}Ga_yAl_xP$ layer, numeral 452 denotes a high carrier concentration region formed in the InGaAlP layer 450, and numeral 454 represents a GaAs layer. Both layers 450 and 454 are of the same conductivity type, i.e., P type. Since the laser is a light-emitting device, it is particularly required that the InGaAlP layer 450 be lattice-matched to the GaAs layer 454. Otherwise, the layer 450 could not be epitaxially grown without impairing its crystalline quality. The values of x and y which meet this requirement are:

$$x+y=0.5 \qquad (16)$$

The results of the experiments the inventors conducted show that the current-voltage characteristic of the heterojunction between the InGaAlP layer 450 and the GaAs layer 454 largely depends on the carrier concentration p and thickness d of the region 452. FIG. 18 is a graph representing the relation which the voltage drop in the interface between the region 452 and the GaAs layer 454 has with the carrier concentration p of the region 452 when a current is supplied to the heterojunction in the density of 1 kA per square centimeter. As is evident from FIG. 18, the voltage drop does not appear at all when $p \geq 5 \times 10^{17}$ atoms per cubic centimeter, and neither the increase in the operating voltage nor the increase in the amount of heat radiated makes a problem. When $p > 3 \times 10^{19}$ atoms per cubic centimeter, however, defects in the high carrier concentration region 452 abruptly increases. The inventors made two lasers, both having the structure shown in FIG. 16, the first one having regions 452 having carrier concentration of more than $3 \times 10^{19}$ atoms per cubic centimeter, and the second one having regions 452 having concentration of $3 \times 10^{19}$ atoms per cubic centimeter or less. The reliability of the first laser was impaired after a 100-hour continuous operation at 50° C. and 3 mW, while the reliability of the second laser remained sufficient up until the laser was continuously operated at 50° C. and 3 mW for 1000 hours or more.

The inventors found that such a voltage drop occurred when the high carrier concentration regions 452 were very thin. FIG. 19 is graph showing the relationship between the voltage drop between layers 454 and 450 and the thickness d of the regions 452 having carrier concentration of $1 \times 10^{18}$ atoms per cubic centimeters. As can be understood from FIG. 19, the voltage drop abruptly increases when the thickness d is less than 40 nanometers. Even when the thickness d is equal to or greater than 40 nanometers, the voltage drop gradually increases with the thickness, due to the increasing series resistance.

The current-voltage characteristic of the heterojunction between the InGaAlP layer 450 and the GaAs layer 454 is greatly influenced by the carrier concentration p and thickness d of the regions 452. To have good current-voltage characteristic, these regions 452 must have a thickness of 40 nanometers or more when its carrier concentration is $5 \times 10^{17}$ atoms per cubic centimeter or more. The regions 452 must have carrier concentration ranging from $5 \times 10^{17}$ atoms per cubic centimeter to $3 \times 10^{19}$ atoms per cubic centimeter; if the carrier concentration is greater than $3 \times 10^{19}$ atoms per cubic centimeter, the laser cannot operate reliably for a long period of time.

FIG. 20 is a sectional view illustrating the main part of a semiconductor laser 500 (not drawn to scale) which is another embodiment of the invention and which has an ohmic contact layer made of GaAs and a cladding layer made of InGaAlP. As is shown in FIG. 20, the laser 500 comprises an N type GaAs substrate 502, an N type InGaAlP cladding layer 504, an InGaAlP active layer 506, and a P type InGaAlP cladding layer 508. The N type cladding layer 504 is formed on the substrate 502. The active layer 506 is formed on the N type cladding layer 504. The P type cladding layer 508 is formed on the active layer 506. The layers 504, 506, and 508 constitute a double-heterostructure, which is the light-emitting section of the laser 500.

A P type InGaP cap layer 510 is formed on the P type cladding layer 508, and an N type GaAs current-blocking layer 512 is formed on the cap layer 510. The current-blocking layer 512 has a stripe-shaped groove section 514 which has been formed by etching an N type GaAs layer. A P type GaAs ohmic contact layer 516 is formed on that portion of the cap layer 510 which is exposed through the groove section 514, and also on the current-blocking layer 512. The layers 504, 506 and 508, forming the double-heterostructure, and the InGaP cap layer 510 have such indium mole fraction, gallium mole fraction, and aluminum composition ratio that they have the same lattice constant as the substrate 502, and that the cladding layers 504 and 508 have bandgap energies greater than that of the active layer 506.

The applicants made semiconductor lasers having the structure shown in FIG. 20, each having a stripe-groove section 514 which had a width of 7 micrometers and a cavity length of 300 micrometers, and a P type InGaP cap layer 510 which had a different carrier concentration and a different thickness. The inventors evaluated the characteristics of these semiconductor lasers.

Of these lasers, the laser, whose P type InGaP cap layer 510 had a carrier concentration of $1 \times 10^{18}$ atoms per cubic centimeter and a thickness of 50 nanometers, exhibited an oscillation threshold current of 70 mA when operated in pulse mode, and an oscillation threshold current of 72 mA when operated continuously. That is, the threshold current changed very little when the operation mode was altered. The maximum continuous oscillation temperature the laser exhibited was 90° C. This is because no excessive voltage drops occurred in the P-GaAs/P-InGaP heterojunction or in the P-InGap/P-InGaAlP heterojunction, and the operating voltage was as low as 2.3 V at the oscillation threshold current.

Of the lasers the inventors had made, the laser, whose P type InGaP cap layer 510 had a carrier concentration of $1 \times 10^{17}$ atoms per cubic centimeter and a thickness of 50 nanometers, exhibited a relatively high operation voltage of 3 V, generated much heat when operated continuously, had a large oscillation threshold current of 77 mA, and exhibited the maximum continuous oscillation temperature of as low as 60° C. This is probably because an excessive voltage drop occurred in the P-GaAs/P-InGaP heterojunction or in the P-InGap/P-InGaAlP heterojunction.

FIG. 21 is a graph representing the dependency of the maximum continuous oscillation temperature on the thickness d of the P type InGaP cap layer 510. As is evident from FIG. 21, the maximum continuous oscillation temperature was as high as 80° C. or more when the thickness d of the P type InGaAs cap layer 510 ranged from 40 nanometers to 80 nanometers, and was low when the thickness d fell outside this range. In particular, the laser exhibited excellent thermal characteristic when the thickness d ranged from 40 nanometers to 60 nanometers.

FIG. 22 is a sectional view illustrating the main part of a semiconductor laser 600 (not drawn to scale) which is still another embodiment of the invention and which has an ohmic contact layer made of GaAs and a cladding layer made of InGaAlP. As is shown in FIG. 22, the laser 600 comprises an N type GaAs substrate 602, an N type InGaAlP cladding layer 604 formed on the substrate 602, an InGaAlP active layer 606 formed on the N type cladding layer 604, a first P type InGaAlP cladding layer 608 formed on the active layer 606, a P type InGaAlP etching stopper layer 610 formed on the first P type cladding layer 608, and a second P type InGaAlP cladding layer 612 formed on the etching stopper layer 610 and stripe-shaped. The layers 604, 606, 608, 610, and 612 constitute a double-heterostructure which is the light-emitting section of the laser 600.

The semiconductor laser 600 further comprises a P type InGaP cap layer 614 formed on the stripe-shaped, second P type cladding layer 612. Two N type GaAs current-blocking layers 616, having the same thickness, are formed on the exposed surface of the etching stopper layer 610. A P type GaAs ohmic contact layer 618 is formed on the cap layer 614 and also on the current-blocking layers 616. The layers forming the double-heterostructure, and the InGaP cap layer 614 have such indium mole fraction, gallium mole fraction, and aluminum composition ratio that they have the same lattice constant as the substrate 602, and that the cladding layers 604, 608, and 612 have bandgap energies greater than that of the active layer 606.

The applicants made semiconductor lasers having shaped the structure shown in FIG. 22, each having a stripe-cladding layer 612 which had a width of 5 micrometers and a cavity length of 300 micrometers, and a P type InGaP cap layer 614 which had a different carrier concentration and a different thickness. The inventors evaluated the characteristics of these semiconductor lasers. They found that the maximum continuous oscillation temperature of each laser depended on the carrier concentration and thickness of the P type InGaP cap layer 614, in substantially the same way as in the laser illustrated in FIG. 20.

The stripe-shaped, P type InGaAlP cadding layer 612 is formed by performing selective etching on a P type InGaP cap layer 614, thereby to etch away the layer 614 except for the center portion which will define the stripe-shaped layer 612. A mixture of Br₂, HBr, and H₂O may be used as etchant in this selective etching. If this is the case, the etching rates of the P type InGaP cap layer 614 and the P type InGaAlP cladding layer 612 tend to become larger partly in a region adjacent to the stripe-shaped section. Hence, to etch the portions of the cap layer 614 other than the center portion, uniformly, it is desirable that the cap layer 614 be as thin as possible, thereby to shorten the etching time. The inventors conducted experiments, ascertaining that the cap layer 614 should be 60 nanometers or less thin to be etched uniformly.

The semiconductor lasers shown in FIGS. 20 and 22 have a cap layer made 614 of P type InGaP. The cap layer 614 can be made of InGaAlP instead, provided that the InGaAlP cap layer has an energy gap smaller than that of the cladding layer 612. If the energy gap of the cap layer 614 is less than that of the cladding layer 612, the difference in energy gap between the layer 612 and the ohmic contact layer 618 will be reduced, and the layer 618 will function as a good contact layer.

Further, either the laser shown in FIG. 15 or the laser shown in FIG. 16 may be combined with the laser illustrated in FIG. 17, 20, or 22, thereby to provide a semiconductor laser which has the advantages of both component lasers.

Still further, the present invention is not limited to the embodiments described above. Various changes and modifications may be made, without departing the scope of the invention.

Moreover, the semiconductor lasers shown in FIGS. 15, 16, 17, 20, and 22 are characterized in that the optical guide layer, which is interposed between the active layer and the N type cladding layer, increases the amount of light leaking into the N type InGaAlP cladding layer, without increasing the thickness of the P type InGaAlP cladding layer which has higher resistivity than the N type InGaAlP cladding layer, thereby to reduce the light density in the active layer. Because of this specific structure, these lasers are high-output, red light-emitting InGaAlP semiconductor lasers which have good temperature characteristics, and are of very high industrial value.

What is claimed is:

1. In a semiconductor laser device comprising:
    a semiconductor substrate;
    a first semiconductor cladding layer formed on said semiconductor;
    a semiconductor active layer formed on said first cladding layer;
    a second semiconductor cladding layer formed on said active layer to define a ridge section and having a conductivity type different from that of said first cladding layer;
    a semiconductive ridge-side layer being in contact with said ridge section; and
    a semiconductor high-refractive-index layer formed in said second cladding layer, dividing said second cladding layer into upper and lower portions, and having a refractive index higher than that of said second cladding layer.

2. The device according to claim 1, wherein said ridge-side layer has a conductivity type opposite to that of said second cladding layer and functions as a current-blocking layer.

3. The device according to claim 2, wherein the lower portion of said second cladding layer is partially processed so as to define a basement of said ridge section.

4. The device according to claim 3, wherein said lower portion of said second cladding layer in said ridge section has a predetermined thickness so as to divert a light beam at a desired angle.

5. The device according to claim 4, wherein said current-blocking layer is greater in its band-gap width than said active layer and said high-refractive-index layer.

6. The device according to claim 4, wherein said current-blocking layer has substantially the same refractive index as said second cladding layer.

7. The device according to claim 4, wherein said ridge section has a rectangular cross section.

8. The device according to claim 4, wherein said ridge section has a mesa-shaped cross section.

9. The device according to claim 4, further comprising:
    a semiconductor cap layer formed on the upper portion of said second cladding layer, and containing no aluminum.

10. The device according to claim 1, wherein said high-refractive index layer is made of $In_t(Ga_{1-w}Al_w)_{1-t}P$, where $0.48 \leq t \leq 0.52$, said ridgeside layer is made of $Ga_{1-u}Al_uAs$, and u and w have values satisfying the following relation:

$$0.48w + 0.23 < u < 0.8.$$

11. The device according to claim 10, wherein u and w have values satisfying the following relation:

$$0.48w + 0.23 < u \leq 0.75.$$

12. The device according to claim 11, wherein said ridge-side layer has a conductivity type opposite to that of said second cladding layer and functions as a current-blocking layer.

13. The device according to claim 10, wherein said ridge-side layer has a band gap width less than that of said active layer.

14. In a semiconductor laser device comprising:
    a semiconductor layer;
    a first cladding layer formed on said semiconductor substrate;
    a semiconductor active layer formed on said first cladding layer;
    a second cladding layer formed on said active layer, having a conductivity type different from that of said first cladding layer, and constituting a double hetero-structure along with said first cladding layer and said second cladding layer;
    light-confining means formed on said second cladding layer and defining, in said second cladding layer, an elongated rectangular light-confining region for guiding light generated by oscillation; and
    an optical guide layer formed between said first cladding layer and said active layer, and having the same conductivity type as said first cladding layer and a refractive index less than that of said active layer and greater than that of said first cladding layer.

15. The device according to claim 14, wherein said optical guide layer is made of indium-gallium-aluminum-phosphide.

16. The device according to claim 15, wherein said second cladding layer is less thick than said first cladding layer.

17. The device according to claim 16, wherein said light-confining means comprises a semiconductor layer formed on said second cladding layer having a conductivity type opposite to that of said second cladding layer and having a groove having an elongated rectangular cross section.

18. The device according to claim 16, wherein said second cladding layer has a ridge section having an elongated rectangular cross section, and said light-confining means comprises a semiconductor layer contacting both sides of said ridge section and having a conductivity type opposite to that of said second cladding layer.

19. In a semiconductor laser device comprising:
a semiconductor substrate;
a first semiconductor cladding layer of a first conductivity type formed on said semiconductor;
a semiconductive active layer formed on said first cladding layer;
a second semiconductor cladding layer of a second conductivity type formed on said active layer and having a conductivity;
a third semiconductor cladding layer of the first conductivity type formed on said second cladding layer and having stripe-shaped groove section;
a semiconductive optical guide layer formed on said third cladding layer so as to cover said groove section;
a semiconductive contact layer of the second conductivity type formed above said optical guide layer; and
said optical guide layer having a refractive index which is greater than that of said third cladding layer.

20. The device according to claim 19, wherein said third cladding layer is made of $In_t(Ga_{1-w}Al_w)_{1-t}P$, where $0.48 \leq t \leq 0.52$, said optical guide layer is made of $Ga_{1-u}Al_uAs$, and u and w have values satisfying the following relation:

$$0.48w + 0.23 < u < 0.8.$$

21. The device according to claim 20, wherein u and w have values satisfying the following relation:

$$0.48w + 0.23 < u \leq 0.75.$$

22. The device according to claim 21 further comprising:
a fourth semiconductive cladding layer of the second conductivity type formed on said optical guide layer, said fourth cladding layer being thick enough to have a flat top surface on which said contact layer is formed.

23. The device according to claim 21, wherein said optical guide layer is thick enough to have a flat top surface on which said contact layer is formed.

* * * * *